(12) United States Patent
Kim et al.

(10) Patent No.: US 12,727,461 B2
(45) Date of Patent: Sep. 1, 2026

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Yeonggil Kim, Suwon-si (KR); Hoon Seok Seo, Suwon-si (KR); Yungbae Kim, Suwon-si (KR); Wookyung You, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 476 days.

(21) Appl. No.: 18/209,206

(22) Filed: Jun. 13, 2023

(65) Prior Publication Data

US 2024/0145345 A1 May 2, 2024

(30) Foreign Application Priority Data

Oct. 26, 2022 (KR) ........................ 10-2022-0139364

(51) Int. Cl.
*H01L 23/48* (2006.01)
*H01L 27/092* (2006.01)
(Continued)

(52) U.S. Cl.
CPC ............ *H10W 20/20* (2026.01); *H10D 30/43* (2025.01); *H10D 30/6735* (2025.01);
(Continued)

(58) Field of Classification Search
CPC .... H10D 84/85; H10D 30/43; H10D 30/6735; H10D 62/121; H01L 23/481;
(Continued)

(56) References Cited

U.S. PATENT DOCUMENTS 8,436,404 B2 5/2013 Bohr et al.
9,818,690 B2 11/2017 Tsai et al.
(Continued)

FOREIGN PATENT DOCUMENTS

CN 114678346 A * 6/2022 ......... H01L 23/5283
CN 114975350 A * 8/2022 ........... H01L 23/481
(Continued)

OTHER PUBLICATIONS

Machine translation, Jiang, Chinese Pat. Pub. No. CN-115206976-A, translation date: Dec. 10, 2025, Clarivate Analytics, all pages. (Year: 2025).*

(Continued)

*Primary Examiner* — Victoria K. Hall
(74) *Attorney, Agent, or Firm* — Muir Patent Law, PLLC

(57) ABSTRACT

A semiconductor device includes active patterns on a substrate, source/drain patterns, first and second separation structures, wherein adjacent source/drain patterns are interposed between the first and second separation structures, an interlayer insulating layer on the source/drain patterns and first and second separation structures, a through-via between the adjacent source/drain patterns, penetrating the interlayer insulating layer, and extending toward the substrate, wherein a top of the through-via is coplanar with a top of the interlayer insulating layer, a dielectric layer selectively on the top of the interlayer insulating layer, and opening the top of the through-via, a power via guided to connect to the top of the through-via by the dielectric layer, a power line on the power via and electrically connected to the through-via through the power via, a power delivery network layer on a bottom of the substrate, and a lower conductor under the through-via.

20 Claims, 40 Drawing Sheets

(51) Int. Cl.

| | |
|---|---|
| ***H01L 29/06*** | (2006.01) |
| ***H01L 29/08*** | (2006.01) |
| ***H01L 29/423*** | (2006.01) |
| ***H01L 29/775*** | (2006.01) |
| ***H01L 29/786*** | (2006.01) |
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/85*** | (2025.01) |
| ***H10W 20/20*** | (2026.01) |

(52) U.S. Cl.

CPC ....... *H10D 30/6757* (2025.01); *H10D 62/121* (2025.01); *H10D 62/151* (2025.01); *H10D 84/85* (2025.01)

(58) Field of Classification Search

CPC . H10W 20/20; H10W 20/211; H10W 20/212; H10W 20/2125; H10W 20/2128; H10W 20/213; H10W 20/2134; H10W 20/215; H10W 20/216; H10W 20/217; H10W 20/218; H10W 20/222; H10W 20/233

See application file for complete search history.

(56) References Cited

U.S. PATENT DOCUMENTS

| | | | | |
|---|---|---|---|---|
| 9,905,538 | B2 | 2/2018 | Kang et al. | |
| 10,867,805 | B2 | 12/2020 | Huang et al. | |
| 11,031,287 | B2 | 6/2021 | Tapily et al. | |
| 2021/0358901 | A1 | 11/2021 | Liu | |
| 2022/0139900 | A1 | 5/2022 | Oh et al. | |
| 2022/0181258 | A1 | 6/2022 | Liebmann et al. | |
| 2022/0208757 | A1* | 6/2022 | Do | H10D 89/10 |
| 2022/0223526 | A1* | 7/2022 | Min | H10D 62/118 |
| 2022/0271045 | A1* | 8/2022 | Ding | H10D 30/6219 |
| 2024/0047305 | A1* | 2/2024 | Oh | H01L 23/481 |
| 2024/0047339 | A1* | 2/2024 | Cha | H10D 84/0149 |
| 2024/0282671 | A1* | 8/2024 | Chen | H10D 84/0149 |
| 2024/0347423 | A1* | 10/2024 | Mukesh | H10D 84/0149 |

FOREIGN PATENT DOCUMENTS

| | | | | |
|---|---|---|---|---|
| CN | 115206976 | A * | 10/2022 | H01L 23/5283 |
| KR | 10-2143518 | B1 | 8/2020 | |
| KR | 20210155868 | A | 12/2021 | |
| KR | 20220077273 | A | 6/2022 | |

OTHER PUBLICATIONS

Machine translation, Pei, Chinese Pat. Pub. No. CN-114975350-A, translation date: Dec. 10, 2025, Clarivate Analytics, all pages. (Year: 2025).*

Machine translation, Li, Chinese Pat. Pub. No. CN-114678346-A, translation date: Dec. 10, 2025, Clarivate Analytics, all pages. (Year: 2025).*

Korean Intellectual Property Office, Written Decision on Registration, Korean Patent Application No. 10-2022-0139364, Jul. 9, 2026, all pages. (Year: 2026).*

* cited by examiner

AP2 (NR2)
TC2
AP1 (PR2)
AP1 (PR1)
AP2 (NR1)
DB
DB2
DB1
TVI3
TVI2
TVI1
TC1
C'
A'
B'
F
F'
GC
GE
CT
E
E'
D
D'
C
A
B
100
M1_R3 (VSS)
AC
SHC2
M1_R2 (VDD)
SHC1
M1_R1 (VSS)
D1
D2
D3

FIG. 5A

SEMICONDUCTOR DEVICE AND METHOD OF MANUFACTURING THE SAME

CROSS-REFERENCE TO RELATED APPLICATIONS

This U.S. non-provisional patent application claims priority under 35 U.S.C. § 119 to Korean Patent Application No. 10-2022-0139364, filed on Oct. 26, 2022, in the Korean Intellectual Property Office, the entire contents of which are hereby incorporated by reference.

BACKGROUND

1. Field

Embodiments relate to a semiconductor device and a method of manufacturing the same, and more particularly, relates to a semiconductor device including a field effect transistor and a method of manufacturing the same.

2. Description of the Related Art

A semiconductor device may include an integrated circuit including metal-oxide-semiconductor field effect transistors (MOSFET). As sizes and design rules of semiconductor devices have been reduced, sizes of MOSFET have also been scaled down. Operating characteristics of semiconductor devices may deteriorate due to the scale down of the MOSFETs. Thus, various research is being conducted for providing semiconductor devices that are capable of overcoming limitations caused by a high integration density and for improving performance.

SUMMARY

A semiconductor device according to some embodiments may include active patterns adjacent to each other on a substrate, source/drain patterns adjacent to each other on the active patterns, respectively, a first separation structure and a second separation structure crossing the active patterns, wherein the adjacent source/drain patterns are interposed between the first and second separation structures, an interlayer insulating layer on the source/drain patterns and the first and second separation structures, a through-via between the adjacent source/drain patterns, the through-via penetrating the interlayer insulating layer and extending toward the substrate, wherein a top surface of the through-via is coplanar with a top surface of the interlayer insulating layer, a dielectric layer selectively provided on the top surface of the interlayer insulating layer, the dielectric layer opening the top surface of the through-via, a power via guided to connect to the top surface of the through-via by the dielectric layer, a power line provided on the power via and electrically connected to the through-via through the power via, a power delivery network layer on a bottom surface of the substrate, and a lower conductor between the power delivery network layer and the through-via.

A semiconductor device according to some embodiments may include a plurality of power lines on a substrate, the power lines arranged in a first direction and parallel to each other in a second direction, a plurality of logic cells two-dimensionally arranged on the substrate, a plurality of tap cells arranged on the substrate in the first direction, and a power delivery network layer below the substrate. Each of the plurality of tap cells may include a lower conductor buried in a lower portion of the substrate, the lower conductor electrically connected to the power delivery network layer, a through-via passing through an interlayer insulating layer and connected to the lower conductor, a dielectric layer selectively provided on a top surface of the interlayer insulating layer, the dielectric layer opening a top surface of the through-via, and a power via electrically connecting the through-via to a corresponding one of the power lines. The power via may be in direct contact with the top surface of the through-via, and a width of the power via may be greater than a width of the through-via.

A semiconductor device according to some embodiments may include a first power line and a second power line on a substrate, the first and second power lines spaced apart from each other in a first direction and extending parallel to each other in a second direction, a logic cell and a tap cell between the first and second power lines, the logic cell and the tap cell adjacent to each other in the second direction, a first active pattern and a second active pattern on the logic cell, the first and second active patterns spaced apart from each other in the first direction, a first channel pattern and a first source/drain pattern on the first active pattern, a second channel pattern and a second source/drain pattern on the second active pattern, the second source/drain pattern having a conductivity type different from that of the first source/drain pattern, an interlayer insulating layer on the first and second source/drain patterns, a first active contact and a second active contact electrically connected to the first and second source/drain patterns, respectively, through the interlayer insulating layer, a first through-via and a second through-via on the tap cell, the first and second through-vias passing through the interlayer insulating layer and extending toward the substrate, a dielectric layer selectively provided on a top surface of the interlayer insulating layer, the dielectric layer exposing top surfaces of the first and second through-vias and top surfaces of the first and second active contacts, a first power via contacting the top surface of the first through-via exposed by the dielectric layer, the first power via electrically connecting the first through-via to the first power line, a second power via contacting the top surface of the second through-via exposed by the dielectric layer, the second power via electrically connecting the second through-via to the second power line, a first via in contact with the top surface of the first active contact exposed by the dielectric layer, the first via electrically connecting the first active contact to the first power line, a second via in contact with the top surface of the second active contact exposed by the dielectric layer, the second via electrically connecting the second active contact to the second power line, a power delivery network layer provided on a bottom surface of the substrate, and a first lower conductor and a second lower conductor respectively provided between the power delivery network layer and the first and second through-vias.

BRIEF DESCRIPTION OF THE DRAWINGS

Features will become apparent to those of skill in the art by describing in detail exemplary embodiments with reference to the attached drawings in which:

FIGS. 5A to 5F are cross-sectional views taken along lines A-A', B-B', C-C', D-D', E-E', and F-F' of FIG. 4, respectively.

DETAILED DESCRIPTION

Figure 1:
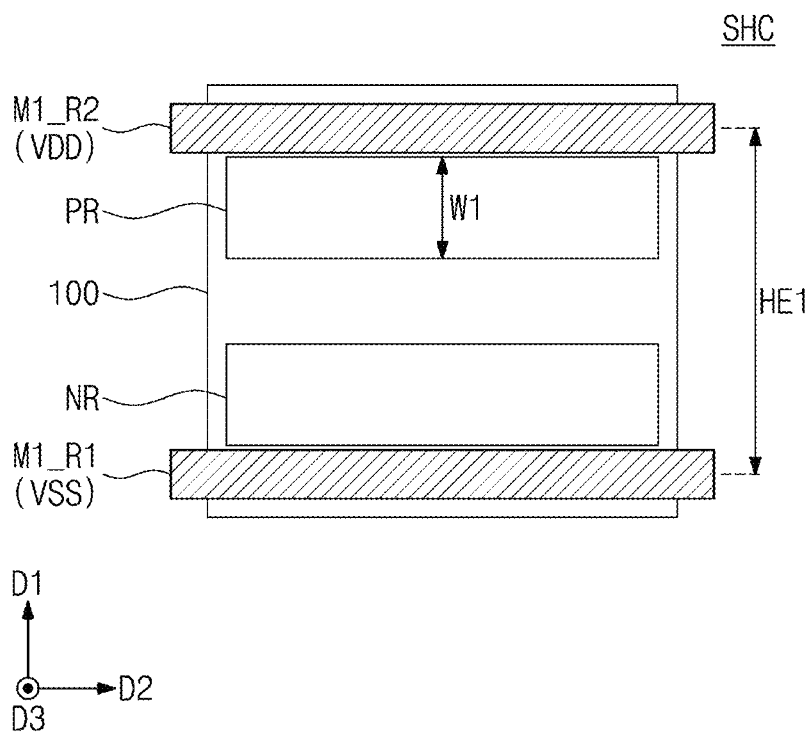
FIGS. 1 to 3 are conceptual views illustrating logic cells of a semiconductor device according to embodiments.
Figure 2:
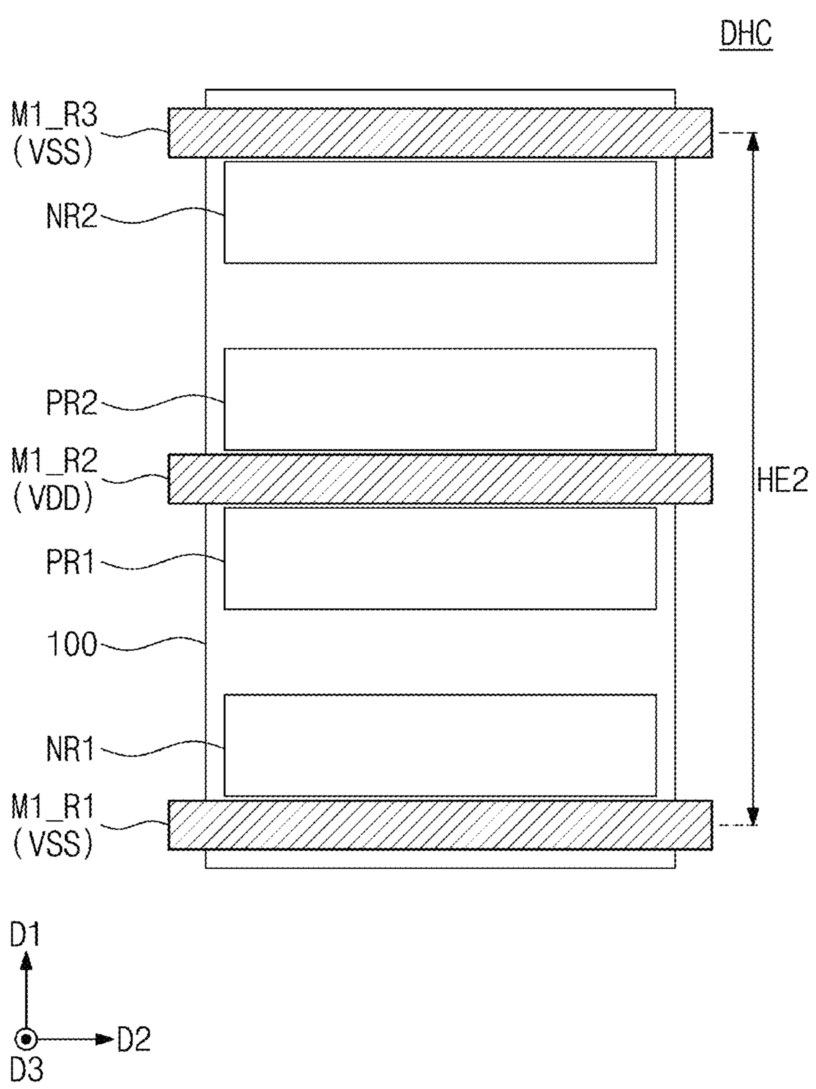
Figure 3:
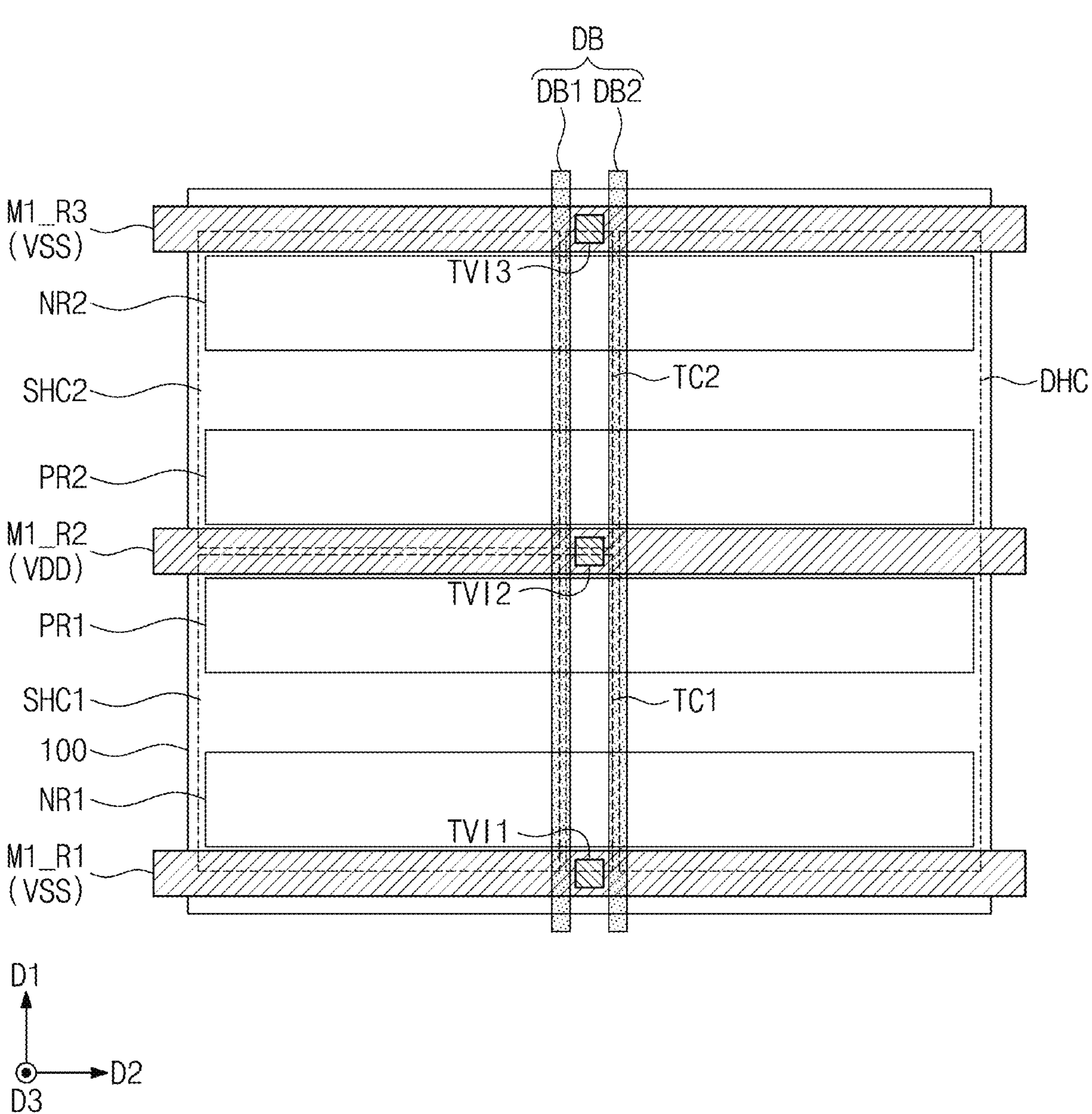

FIGS. 1 to 3 are conceptual views illustrating logic cells of a semiconductor device according to embodiments.

Referring to FIG. 1, a single height cell SHC may be provided. In detail, a first power line M1_R1 and a second power line M1_R2 may be provided on a lower portion of a substrate 100. The first power line M1_R1 may be a passage through which a source voltage VSS, (for example, a ground voltage) is provided. The second power line M1_R2 may be a passage through which the drain voltage VDD, (for example, a power voltage is provided).

The single height cell SHC may be defined between the first power line M1_R1 and the second power line M1_R2. The single height cell SHC may include one PMOSFET region PR and one NMOSFET region NR. That is, the single height cell SHC may have a CMOS structure provided between the first power line M1_R1 and the second power line M1_R2.

Each of the PMOSFET region PR and the NMOSFET region NR may have a first width W1 in a first direction D1. A length of the single height cell SHC in the first direction D1 may be defined as a first height HE1. The first height HE1 may be substantially equal to a distance (e.g., pitch) between the first power line M1_R1 and the second power line M1_R2.

The single height cell SHC may constitute one logic cell. In this specification, the term "logic cell" may refer to a logic element (e.g., AND, OR, XOR, XNOR, inverter, etc.) that performs a specific function. That is, the logic cell may include transistors constituting logic elements and lines connecting the transistors to each other.

Referring to FIG. 2, a double height cell DHC may be provided. In detail, a first power line M1_R1, a second power line M1_R2, and a third power line M1_R3 may be provided on a substrate 100. The second power line M1_R2 may be disposed between the first power line M1_R1 and the third power line M1_R3. The third power line M1_R3 may be a passage through which a source voltage VSS is provided.

The double height cell DHC may be defined between the first power line M1_R1 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the first power line M1_R1. The second NMOSFET region NR2 may be adjacent to the third power line M1_R3. The first and second PMOSFET regions PR1 and PR2 may be adjacent to the second power line M1_R2. When viewed from a plan view, the second power line M1_R2 may be disposed between the first and second PMOSFET regions PR1 and PR2.

A length of the double height cell DHC in a first direction D1 may be defined as a second height HE2. The second height HE2 may be about twice the first height HE1 of FIG. 1. The first and second PMOSFET regions PR1 and PR2 of the double height cell DHC may be grouped together to operate as one PMOSFET region. Accordingly, a channel size of the PMOS transistor of the double height cell DHC may be larger than a channel size of the PMOS transistor of the single height cell SHC of FIG. 1.

For example, a size of the channel of the PMOS transistor of the double height cell DHC may be about twice a size of the channel of the PMOS transistor of the single height cell SHC. As a result, the double height cell DHC may operate at a higher speed than the single height cell SHC. The double height cell DHC shown in FIG. 2 may be defined as a multi-height cell. Although not shown, the multi-height cell may include a triple-height cell having a cell height of about three times that of a single-height cell SHC.

Referring to FIG. 3, a first single height cell SHC1, a second single height cell SHC2, and a double height cell DHC may be disposed two-dimensionally on a substrate 100. The first single height cell SHC1 may be disposed between first and second power lines M1_R1 and M1_R2. The second single height cell SHC2 may be disposed between second and third power lines M1_R2 and M1_R3. The second single-height cell SHC2 may be adjacent to the first single-height cell SHC1 in a first direction D1.

The double height cell DHC may be disposed between the first and third power lines M1_R1 and M1_R3. The double height cell DHC may be adjacent to the first and second single height cells SHC1 and SHC2 in a second direction D2.

A first tap cell TC1 may be provided between the first single height cell SHC1 and the double height cell DHC. A second tap cell TC2 may be provided between the second single height cell SHC2 and the double height cell DHC. The first tap cell TC1 and the second tap cell TC2 may be aligned in the first direction D1.

Each of the first and second tap cells TC1 and TC2 may be a cell for applying a voltage from a power delivery network, to be described later, to the power lines M1_R1 to M1_R3. Unlike a logic cell, a tap cell may not include a logic element. That is, the tap cell may be a type of dummy cell that performs a function of applying a voltage to a power line, but does not perform a circuit function.

As illustrated in FIG. 3, the first and second tap cells TC1 and TC2 may be disposed between logic cells SHC1, SHC2, and DHC within a cell region where the logic cells SHC1, SHC2, and DHC are disposed. An arrangement between the first and second tap cells TC1 and TC2 and the logic cells SHC1, SHC2 and DHC shown in FIG. 3 is merely exemplary, and the arrangement between the logic cells and the tap cells may be variously changed.

In an embodiment, a first separation structure DB1 may be provided between the first tap cell TC1 and the first single height cell SHC1 and between the second tap cell TC2 and the second single height cell SHC2. A second separation structure DB2 may be provided between the first tap cell TC1 and the double height cell DHC and between the second tap cell TC2 and the double height cell DHC. Active regions of the logic cells SHC1, SHC2, and DHC may be electrically separated from active regions of the tap cells TC1 and TC2 by a separation structure DB.

The first and second tap cells TC1 and TC2 may include first to third through-vias TVI1, TVI2 and TVI3 respectively connected to the first to third power lines M1_R1, M1_R2 and M1_R3. The first to third power lines M1_R1, M1_R2, and M1_R3 may be electrically connected to the power delivery network under the substrate 100 through the first to third through-vias TVI1, TVI2, and TVI3.

Figure 4:
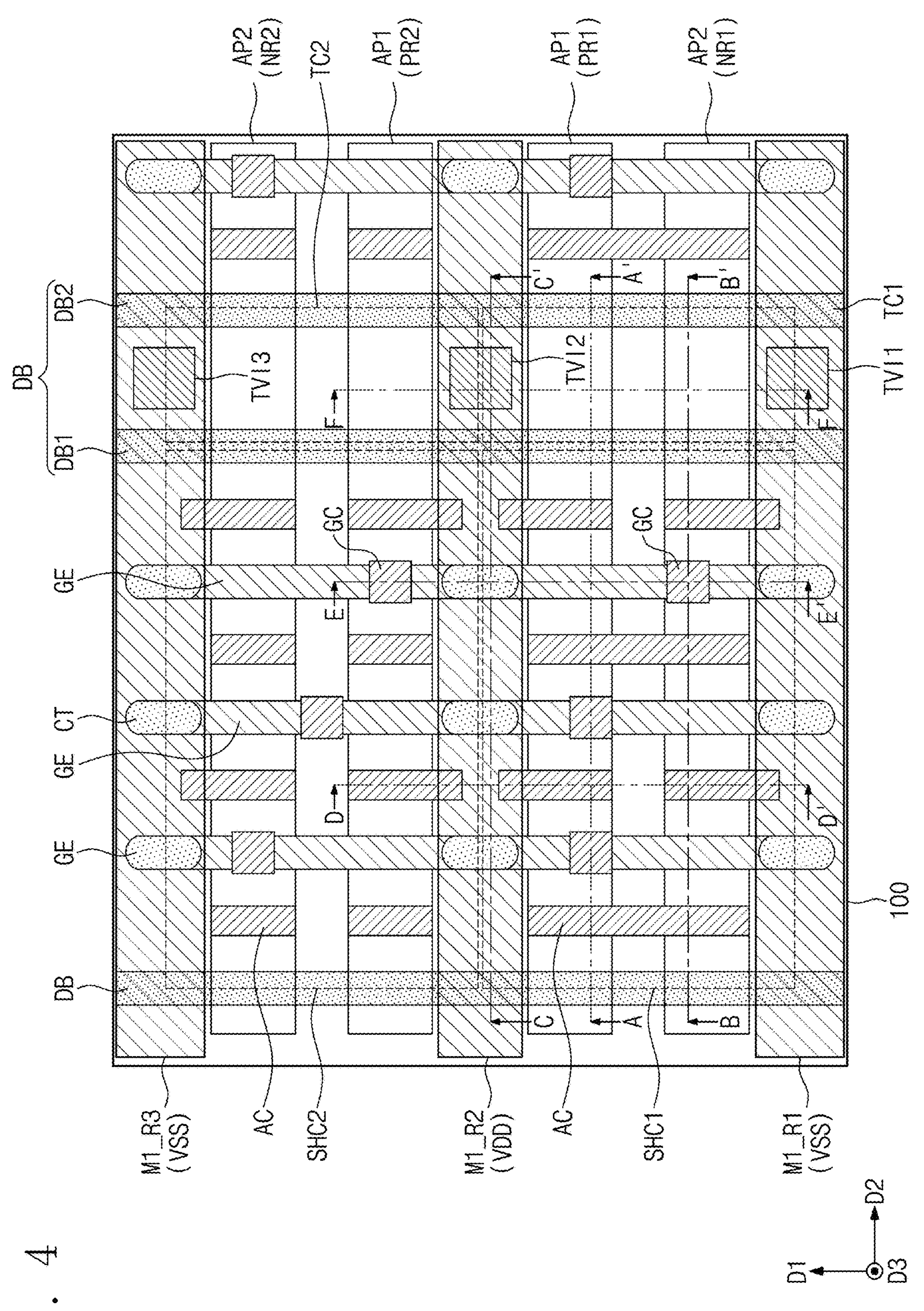
FIG. 4 is a plan view illustrating a semiconductor device according to embodiments.

FIG. 4 is a plan view illustrating a semiconductor device according to embodiments. FIGS. 5A to 5F are cross-sectional views taken along lines A-A', B-B', C-C', D-D', E-E', and F-F' of FIG. 4, respectively. The semiconductor device shown in FIGS. 4 and 5A to 5F is provided as an example that illustrates the first and second single height cells SHC1 and SHC2 and the first and second tap cells TC1 and TC2 of FIG. 3 in more detail.

Referring to FIGS. 4 and 5A to 5F, first and second single height cells SHC1 and SHC2 and first and second tap cells TC1 and TC2 may be provided on a substrate 100. Logic transistors constituting a logic circuit may be disposed on each of the first and second single height cells SHC1 and SHC2. Dummy transistors may be disposed on each of the first and second tap cells TC1 and TC2. The substrate 100 may be a semiconductor substrate including silicon, germanium, silicon-germanium, or the like, or a compound semiconductor substrate. For example, the substrate 100 may be a silicon substrate.

The substrate 100 may have a first PMOSFET region NU, a second PMOSFET region PR2, a first NMOSFET region NR1, and a second NMOSFET region NR2. Each of the first PMOSFET region NU, the second PMOSFET region PR2, the first NMOSFET region NR1, and the second NMOSFET region NR2 may extend in a second direction D2. The first single height cell SHC1 may include the first NMOSFET region NR1, and the first PMOSFET region PR1, and the second single height cell SHC2 may include the second PMOSFET region PR2 and the second NMOSFET region NR2.

A first active pattern AP1 and a second active pattern AP2 may be defined by a trench TR formed on a top surface of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may extend in the second direction D2. The first and second active patterns AP1 and AP2 may be portions of the substrate 100 and may be vertically protruding portions.

An isolation layer ST may fill the trench TR. The device isolation layer ST may include a silicon oxide layer. The device isolation layer ST may not cover first and second channel patterns CH1 and CH2, which will be described later.

The first channel pattern CH1 may be provided on the first active pattern AP1. The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 sequentially stacked. The first to third semiconductor patterns SP1, SP2, and SP3 may be spaced apart from each other in a vertical direction (i.e., in a third direction D3).

Each of the first to third semiconductor patterns SP1, SP2, and SP3 may include silicon (Si), germanium (Ge), or silicon-germanium (SiGe). For example, each of the first to third semiconductor patterns SP1, SP2, and SP3 may include crystalline silicon. Each of the first to third semiconductor patterns SP1, SP2, and SP3 may be in a form of a nanosheet.

A plurality of first source/drain patterns SD1 may be provided on the first active pattern AP1. A plurality of first recesses RS1 may be formed on the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between a pair of first source/drain patterns SD1. That is, the stacked first to third semiconductor patterns SP1, SP2, and SP3 may connect the pair of first source/drain patterns SD1 to each other.

A plurality of second source/drain patterns SD2 may be provided on the second active pattern AP2. The plurality of second recesses RS2 may be formed on the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between a pair of second source/drain patterns SD2. That is, the stacked first to third semiconductor patterns SP1, SP2, and SP3 may connect the pair of second source/drain patterns SD2 to each other.

The first and second source/drain patterns SD1 and SD2 may be epitaxial patterns formed through a selective epitaxial growth (SEG) process. For example, a top surface of each of the first and second source/drain patterns SD1 and SD2 may be positioned at substantially the same level as a top surface of the third semiconductor pattern SP3. As another example, a top surface of each of the first and second source/drain patterns SD1 and SD2 may be higher than a top surface of the third semiconductor pattern SP3.

The first source/drain patterns SD1 may include a semiconductor element (e.g., SiGe) having a lattice constant greater than that of a semiconductor element of the substrate 100. Thus, the pair of first source/drain patterns SD1 may provide compressive stress to the first channel pattern CH1 therebetween. The second source/drain patterns SD2 may include the same semiconductor element (e.g., Si) as the substrate 100.

Each of the first source/drain patterns SD1 may include a buffer layer BFL and a main layer MAL on the buffer layer BFL. Referring back to FIG. 5A, the buffer layer BFL may cover an inner wall of the first recess RS1. In one embodiment, the buffer layer BFL may have a substantially conformal thickness. For example, a thickness of the buffer layer BFL on a bottom of the first recess RS1 in the third direction D3 may be substantially equal to a thickness of the buffer layer BFL on a top of the first recess RS1 in the second direction D2.

In another embodiment, the thickness of the buffer layer BFL may decrease from a lower portion thereof to an upper portion thereof. For example, the thickness of the buffer layer BFL on the bottom of the first recess RS1 in the third direction D3 may be greater than the thickness of the buffer layer BFL on the top of the first recess RS1 in the second direction D2. The buffer layer BFL may have a U-shape along a profile of the first recess RS1.

The main layer MAL may fill most of the remaining region of the first recess RS1 except for the buffer layer BFL. A volume of the main layer MAL may be greater than that of the buffer layer BFL. Each of the buffer layer BFL and the main layer MAL may include silicon-germanium (SiGe). In detail, the buffer layer BFL may contain germanium (Ge) at a relatively low concentration. In another embodiment, the buffer layer BFL may contain only silicon (Si) excluding germanium (Ge). A concentration of germanium (Ge) in the buffer layer BFL may be 0 at % to 10 at %.

The main layer MAL may contain germanium (Ge) at a relatively high concentration. For example, a concentration of germanium (Ge) in the main layer MAL may be 30 at % to 70 at %. The concentration of germanium (Ge) in the main layer MAL may increase in the third direction D3. For example, the main layer MAL adjacent to the buffer layer BFL may have a germanium (Ge) concentration of about 40 at %, while an upper portion of the main layer MAL may have a germanium (Ge) concentration of about 60 at %.

Each of the buffer layer BFL and the main layer MAL may include impurities (e.g., boron, gallium, or indium) that cause the first source/drain pattern SD1 to have a p-type. An impurity concentration of each of the buffer layer BFL and the main layer MAL may being a range of $1E^{18}$ atom/$cm^3$ to $5E^{22}$ atom/$cm^3$. The impurity concentration of the main layer MAL may be greater than that of the buffer layer BFL.

The buffer layer BFL may prevent a stacking fault from occurring between the substrate 100 (i.e., the first active pattern AP1) and the main layer MAL and between the first to third semiconductor patterns SP1, SP2 and SP3 and the main layer MAL. When a stacking fault occurs, channel resistance may increase. The buffer layer BFL may protect the main layer MAL during a process of replacing second semiconductor layers SAL with first to third inner electrodes PO1, PO2, and PO3 of a gate electrode GE, which will be described later. That is, the buffer layer BFL may prevent an etching material from removing the second semiconductor layers SAL and from penetrating into and etching the main layer MAL.

Each of the second source/drain patterns SD2 may include silicon (Si). The second source/drain pattern SD2 may further include impurities (e.g., phosphorus, arsenic, or antimony) that may cause the second source/drain pattern SD2 to have a n-type. An impurity concentration of the second source/drain pattern SD2 may be in a range of $1E^{18}$ atom/$cm^3$ to $5E^{22}$ atom/$cm^3$.

Gate electrodes GE may be provided to cross the first and second channel patterns CH1 and CH2. The gate electrodes may extend in a first direction D1. The gate electrodes GE may be arranged in the second direction D2 by a first pitch. Each of the gate electrodes GE may vertically overlap the first and second channel patterns CH1 and CH2.

The gate electrode GE may include a first inner electrode PO1 interposed between the active pattern AP1 or AP2 and the first semiconductor pattern SP1, a second inner electrode PO2 interposed between the first semiconductor pattern SP1 and the second semiconductor pattern SP2, a third inner electrode PO3 interposed between the second and third semiconductor patterns SP2 and SP3, and an outer electrode PO4 on the third semiconductor pattern SP3.

Referring back to FIG. 5E, the gate electrode GE may be provided on a top surface TS, a bottom surface BS, and both sidewalls SW of each of the first to third semiconductor patterns SP1, SP2, and SP3. That is, a transistor according to the present embodiment may be a three-dimensional field effect transistor (e.g., MBCFET or GAAFET) in which the gate electrode GE surrounds the channel in three dimensions.

Gate cutting patterns CT may be provided on a boundary between the first and second single height cells SHC1 and SHC2. The gate cutting patterns CT may be arranged by the first pitch in the boundary. When viewed from a plan view, the gate cutting patterns CT may be disposed on the gate electrodes GE to overlap the gate electrodes GE, respectively. The gate cutting patterns CT may include an insulating material such as a silicon oxide layer, a silicon nitride layer, or a combination thereof.

The gate electrode GE on the first single height cell SHC1 may be separated from the gate electrode GE on the second single height cell SHC2 by the gate cutting pattern CT. The gate cutting pattern CT may be interposed between the gate electrode GE on the first single height cell SHC1 and the gate electrode GE on the second single height cell SHC2 which is aligned with the first single height cell SHC1 in the first direction D1. That is, the gate electrode GE extending in the first direction D1 may be separated into a plurality of gate electrodes GE by the gate cutting patterns CT.

Referring again to FIGS. 4 and 5A to 5F, a pair of gate spacers GS may be respectively disposed on both sidewalls of the outer electrode PO4 of the gate electrode GE. The gate spacers GS may extend in the first direction D1 along the gate electrode GE. Top surfaces of the gate spacers GS may be higher than a top surface of the gate electrode GE. The top surfaces of the gate spacers GS may be coplanar with a top surface of a first interlayer insulating layer 110 to be described later. The gate spacers GS may include at least one of SiCN, SiCON, and SiN. As another example, the gate spacers GS may include a multi-layer made of at least two of SiCN, SiCON, and SiN.

A gate capping pattern GP may be provided on the gate electrode GE. The gate capping pattern GP may extend in the first direction D1 along the gate electrode GE. The gate capping pattern GP may include a material having etch selectivity with respect to first and second interlayer insulating layers 110 and 120 to be described later. In detail, the gate capping pattern GP may include at least one of SiON, SiCN, SiCON, and SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the both sidewalls SW of each of the first to third semiconductor patterns SP1, SP2, and SP3 (refer to FIG. 5E). The gate insulating layer GI may cover a top surface of the device isolation layer ST under the gate electrode GE.

In an embodiment, the gate insulating layer GI may include a silicon oxide layer, a silicon oxynitride layer, and/or a high-k dielectric layer. The high-k layer may include a high-k material having a higher dielectric constant than that of the silicon oxide layer. For example, the high-k material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal for adjusting a threshold voltage of the transistor. A desired threshold voltage of the transistor may be achieved by adjusting a thickness and composition of the first metal pattern. For example, the first to third inner electrodes PO1, PO2, and PO3 of the gate electrode GE may be formed of a first metal pattern, wherein the metal of the first metal pattern is a work function metal.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). Furthermore, the first metal pattern may further include carbon (C). The first metal pattern may include a plurality of stacked work function metal layers.

The second metal pattern may include a metal having lower resistance than that of the first metal pattern. For example, the second metal pattern may include at least one metal selected from the group consisting of tungsten (W), aluminum (Al), titanium (Ti), and tantalum (Ta). The outer electrode PO4 of the gate electrode GE may include the first metal pattern and the second metal pattern on the first metal pattern.

Referring back to FIG. 5B, inner spacers IP may be provided on the first and second NMOSFET regions NR1 and NR2. That is, inner spacers IP may be provided on the second active pattern AP2. The inner spacers IP may be interposed between the first to third inner electrodes PO1, PO2, and PO3 of the gate electrode GE and the second source/drain pattern SD2, respectively. The inner spacers IP may be in direct contact with the second source/drain pattern SD2. Each of the first to third inner electrodes PO1, PO2, and PO3 of the gate electrode GE may be spaced apart from the second source/drain pattern SD2 by the inner spacer IP.

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with a top surface of the gate capping pattern GP and a top surface of the gate spacer GS. A second interlayer insulating layer 120 covering the gate capping pattern GP may be disposed on the first interlayer insulating layer 110. A third interlayer insulating layer 130 may be provided on the second interlayer insulating layer 120. A fourth interlayer insulating layer 140 may be provided on the third interlayer insulating layer 130. For example, the first to fourth interlayer insulating layers 110 to 140 may include a silicon oxide layer.

Separation structures DB may be provided at boundaries between cells, respectively. For example, a first separation structure DB1 may be provided between the first and second single height cells SHC1 and SHC2 and the first and second tap cells TC1 and TC2. A second separation structure DB2 may be provided between the first and second tap cells TC1 and TC2 and another logic cell adjacent thereto. Each of the first and second tap cells TC1 and TC2 may be provided between a pair of separation structures DB1 and DB2.

The separation structure DB may extend parallel to the gate electrodes GE in the first direction D1. A pitch between the separation structure DB and the gate electrode GE adjacent thereto may be the same as the first pitch. In an embodiment, a width of each of the first and second tap cells TC1 and TC2 in the second direction D2 may be substantially equal to the first pitch.

The separation structure DB may pass through the first and second interlayer insulating layers 110 and 120 and extend into the first and second active patterns AP1 and AP2. The separation structure DB may pass through upper portions of each of the first and second active patterns AP1 and AP2. The separation structure DB may electrically separate an active region of one cell from an active region of another cell adjacent thereto.

Active contacts AC electrically connected to the first and second source/drain patterns SD1 and SD2 may be provided through the first and second interlayer insulating layers 110 and 120, respectively. A pair of active contacts AC may be provided on both sides of the gate electrode GE, respectively. When viewed from a plan view, the active contact AC may have a bar shape extending in the first direction D1.

The active contact AC may be a self-aligned contact. That is, the active contact AC may be formed in a self-aligned manner using the gate capping pattern GP and the gate spacer GS. For example, the active contact AC may cover at least a portion of the sidewall of the gate spacer GS. The active contact AC may cover a portion of the top surface of the gate capping pattern GP.

A metal-semiconductor compound layer SC such as, for example, a silicide layer, may be interposed between the active contact AC and the first source/drain pattern SD1 and between the active contact AC and the second source/drain pattern SD2, respectively. The active contact AC may be electrically connected to the source/drain patterns SD1 and SD2 through the metal-semiconductor compound layer SC. For example, the metal-semiconductor compound layer SC may include at least one of titanium-silicide, tantalum-silicide, tungsten-silicide, nickel-silicide, or cobalt-silicide.

Gate contacts GC electrically connected to the gate electrodes GE may be provided through the second interlayer insulating layer 120 and the gate capping pattern GP. When viewed from a plan view, two gate contacts GC on the first single height cell SHC1 may be disposed to overlap the first PMOSFET region PR1. That is, the two gate contacts GC on the first single height cell SHC1 may be provided on the first active pattern AP1 (refer to FIG. 5A). When viewed from a plan view, one gate contact GC on the first single height cell SHC1 may be disposed to overlap the first NMOSFET region NR1. That is, one gate contact GC on the first single height cell SHC1 may be provided on the second active pattern AP2 (refer to FIG. 5B).

The gate contact GC may be freely disposed on the gate electrode GE without limiting the location thereof. For example, the gate contacts GC of the second single height cell SHC2 may be disposed on the device isolation layer ST filling the second PMOSFET region PR2, the second NMOSFET region NR2, and the trench TR, respectively (refer to FIG. 4).

Figure 5A:
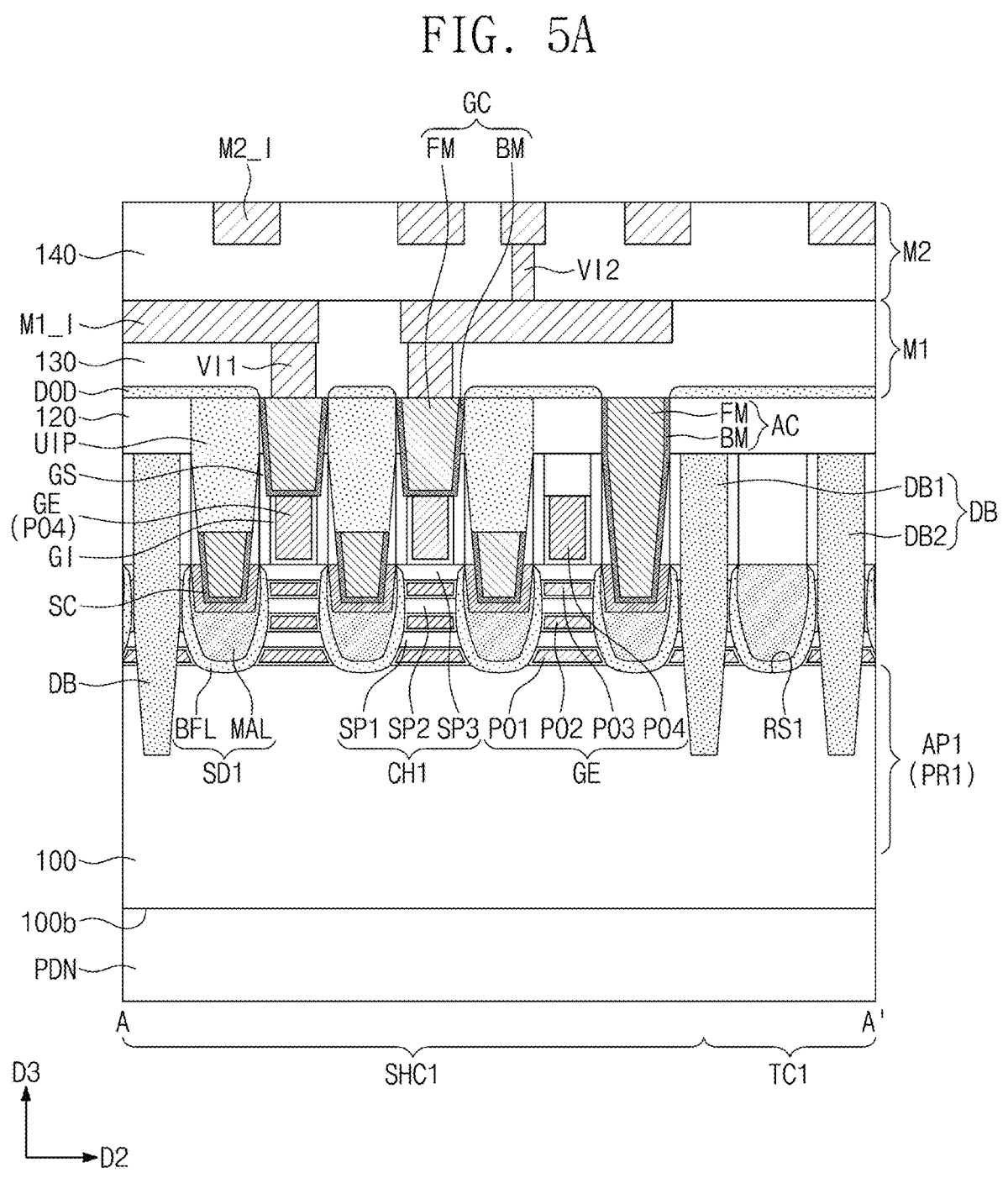
Figure 5B:
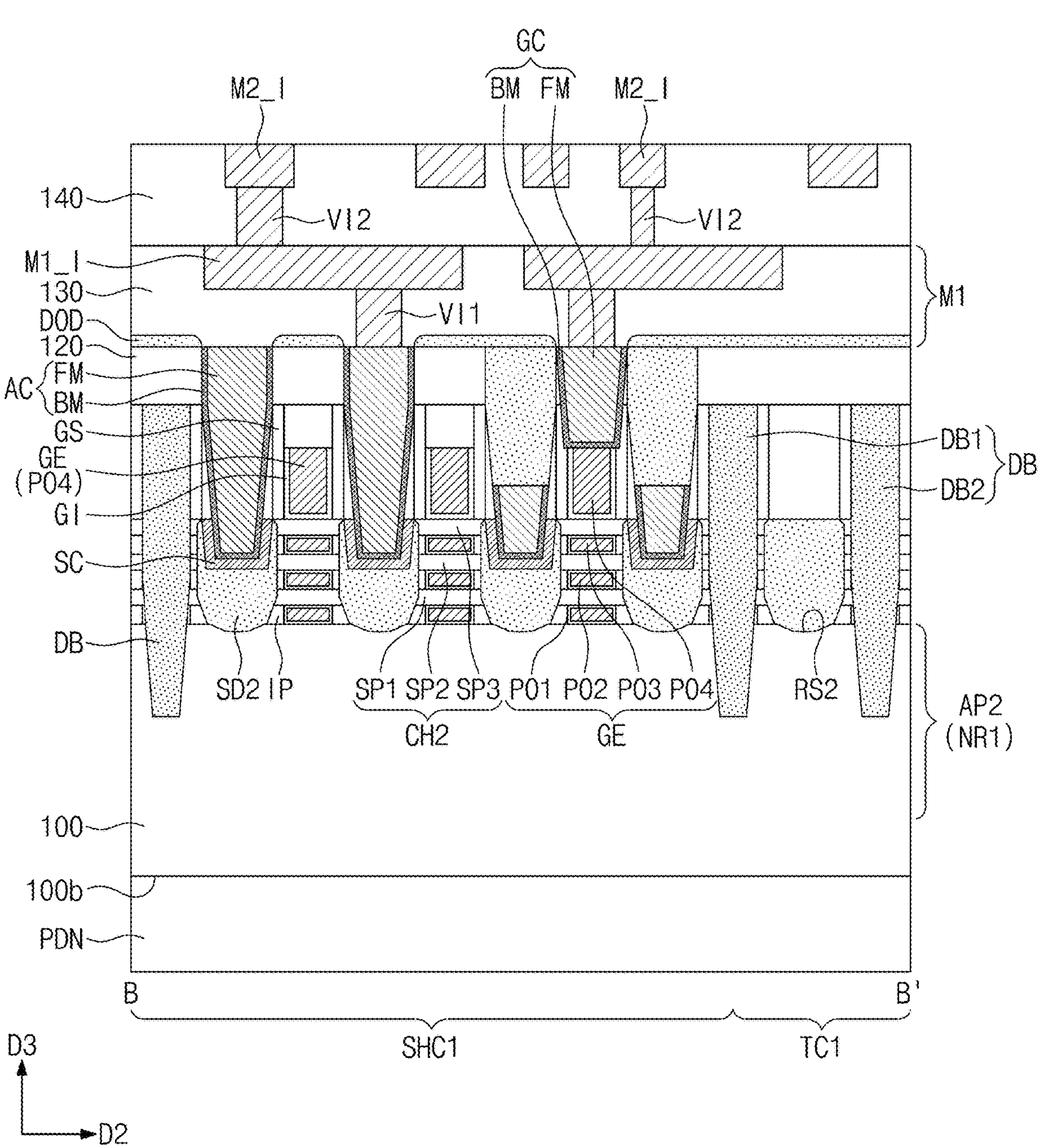
Figure 5C:
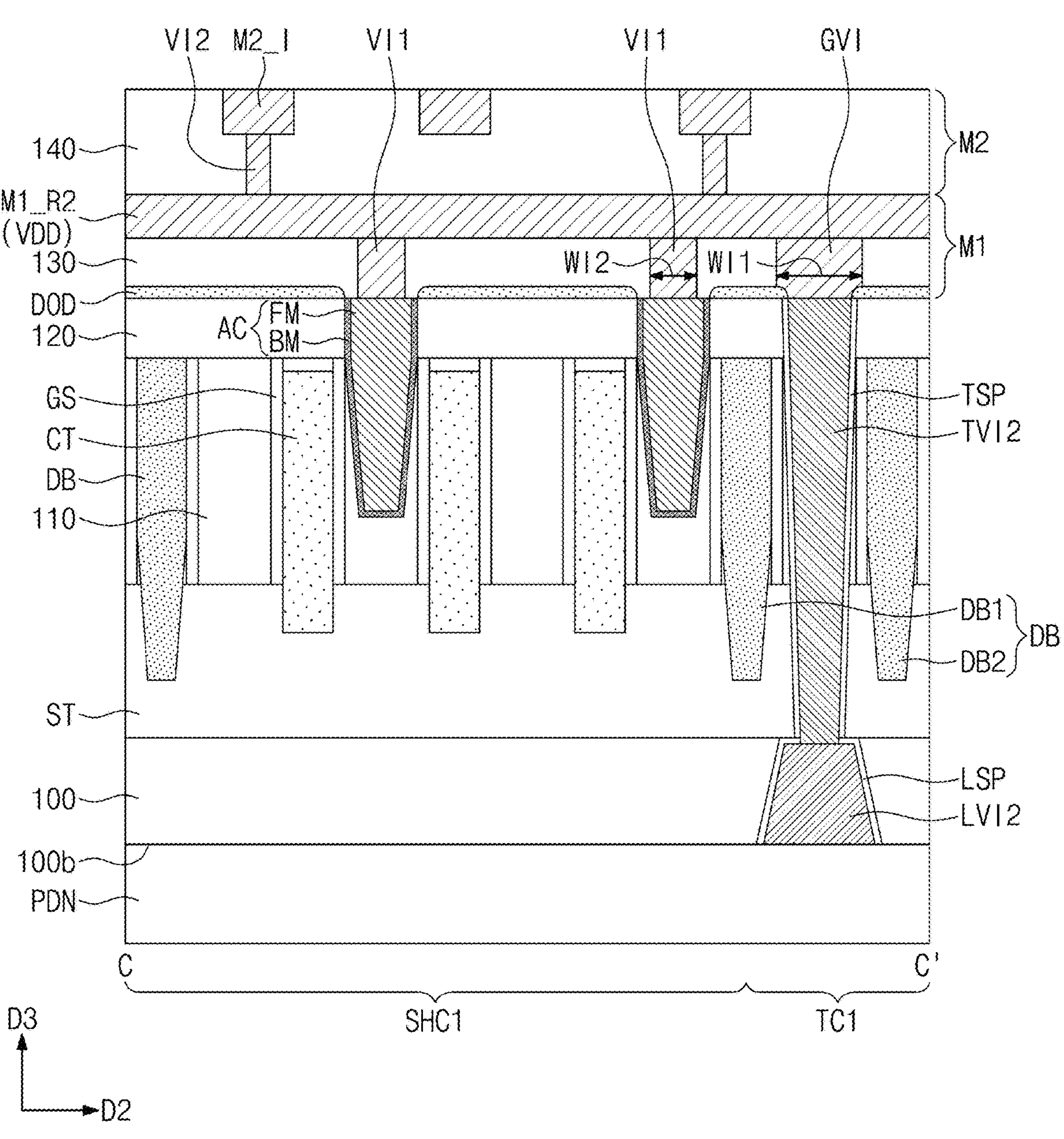
Figure 5D:
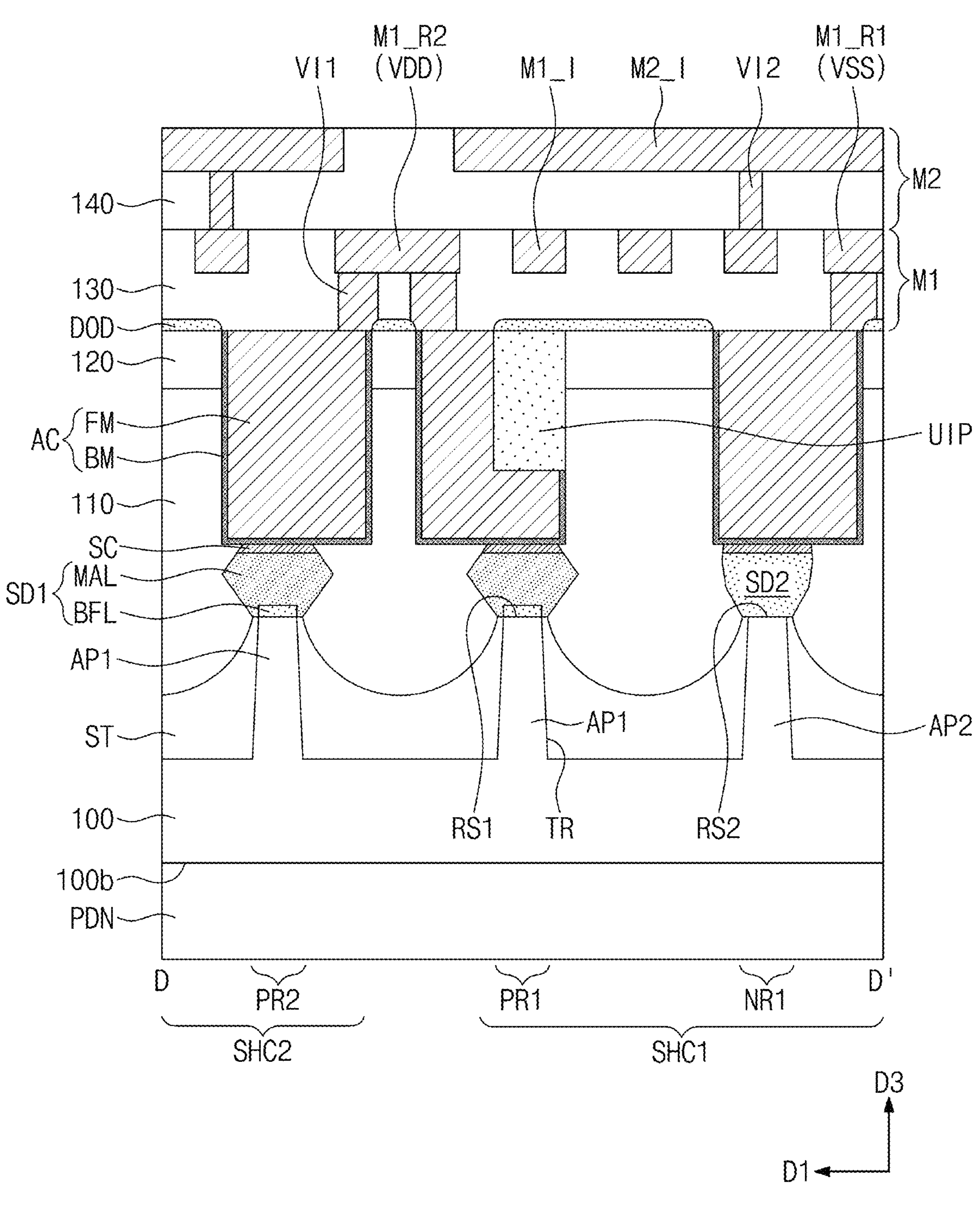
Figure 5E:
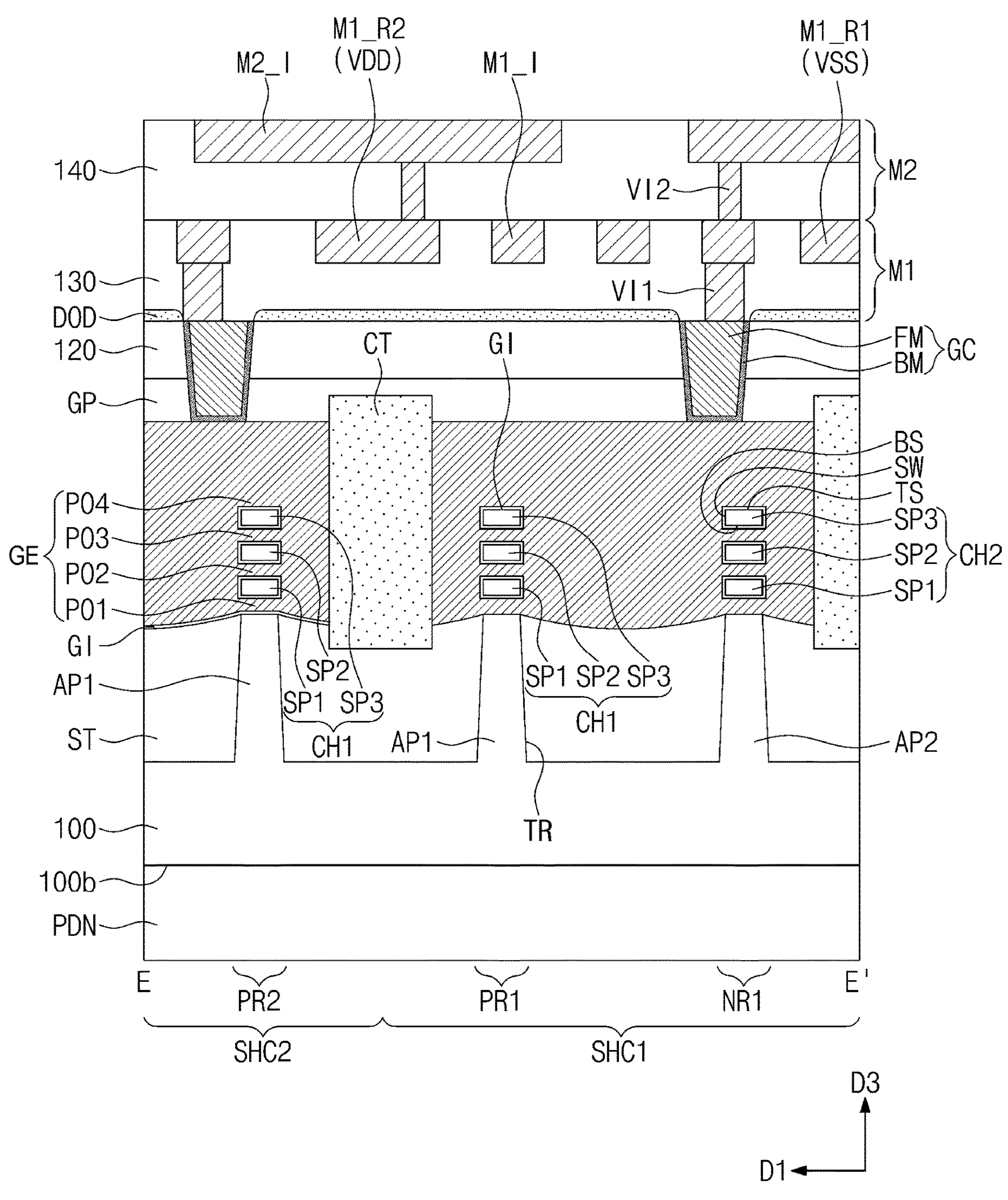
Figure 5F:
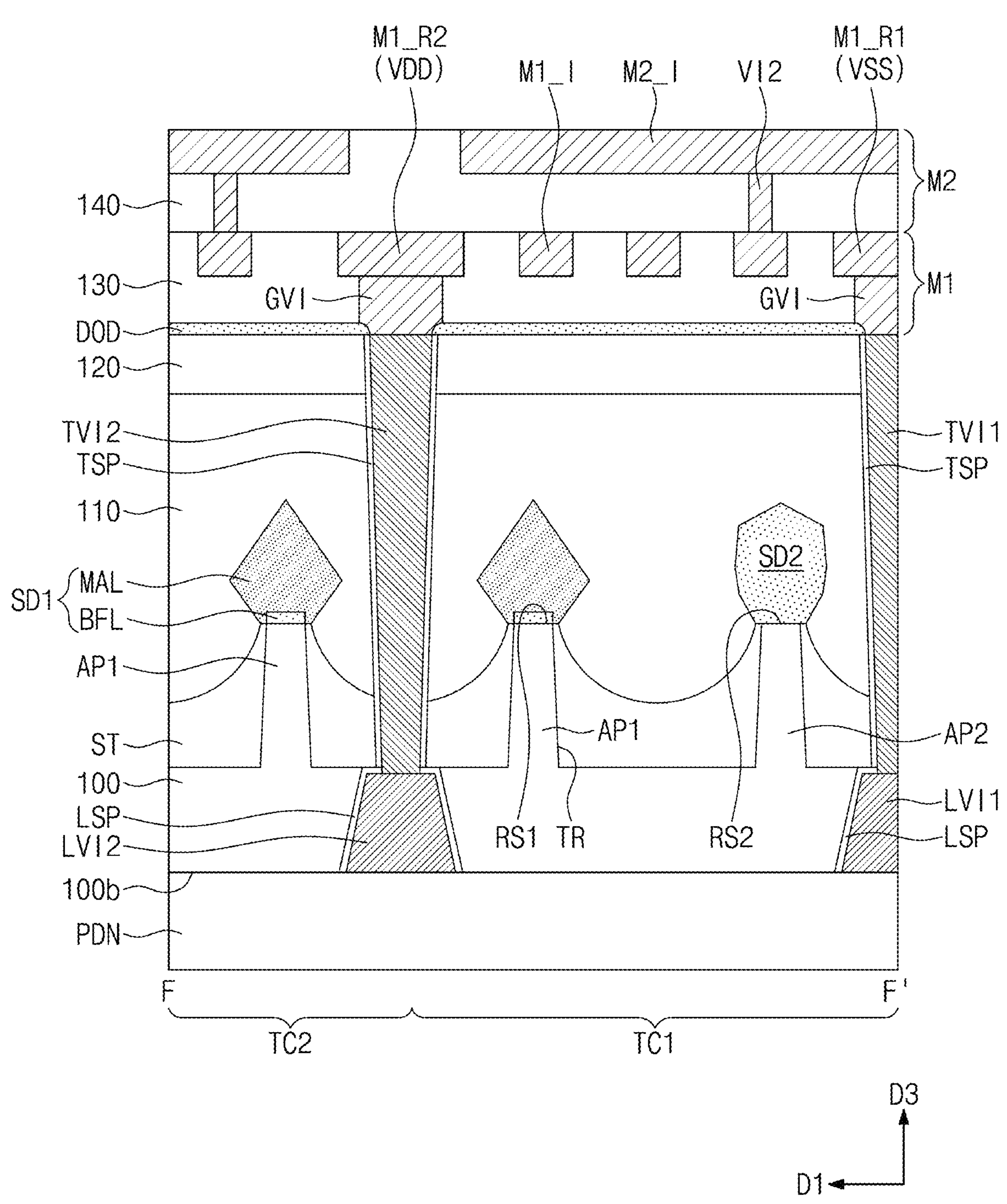

As an embodiment, referring to FIGS. 5A and 5D, an upper portion of the active contact AC adjacent to the gate contact GC may be filled with an upper insulating pattern UIP. A bottom surface of the upper insulating pattern UIP may be lower than a bottom surface of the gate contact GC. That is, a top surface of the active contact AC adjacent to the gate contact GC may be lower than a bottom surface of the gate contact GC due to the upper insulating pattern UIP. Accordingly, a short circuit may be prevented by contact between the gate contact GC and the active contact AC adjacent thereto.

Each of the active contact AC and gate contact GC may include a conductive pattern FM and a barrier pattern BM surrounding the conductive pattern FM. For example, the conductive pattern FM may include at least one of aluminum, copper, tungsten, molybdenum, and cobalt. The barrier pattern BM may cover sidewalls and a bottom surface of the conductive pattern FM. The barrier pattern BM may include a metal layer/metal nitride layer. The metal layer may include at least one of titanium, tantalum, tungsten, nickel, cobalt, and platinum. The metal nitride layer may include at least one of a titanium nitride layer (TiN), a tantalum nitride layer (TaN), a tungsten nitride layer (WN), a nickel nitride layer (NiN), a cobalt nitride layer (CoN), and a platinum nitride layer (PtN).

Referring back to FIGS. 4, 5C and 5F, a first metal layer M1 may be provided in the third interlayer insulating layer 130. The first metal layer M1 may include first to third power lines M1_R1, M1_R2, and M1_R3. The first to third power lines M1_R1, M1_R2, and M1_R3 may extend parallel to each other in the second direction D2. The first power line M1_R1 may be disposed on one boundary of the first single height cell SHC1. The second power line M1_R2 may be disposed on a boundary between the first and second single height cells SHC1 and SHC2. The third power line M1_R3 may be disposed on one boundary of the second single height cell SHC2.

Referring again to FIGS. 5C and 5D, the second power line M1_R2 may be electrically connected to at least one active contact AC. A first via VI1 may be provided between the second power line M1_R2 and the at least one active contact AC.

Referring back to FIGS. 4, 5C, and 5F, first to third through-vias TVI1, TVI2, and TVI3 electrically connected to the first to third power lines M1_R1, M1_R2, and M1_R3, respectively, may be provided on the first and second tap cells TC1 and TC2.

Representatively, the second through-via TVI2 may vertically extend from the second interlayer insulating layer 120 to a lower portion of the substrate 100. A top surface of the second through-via TVI2 may be coplanar with a top surface of the second interlayer insulating layer 120. A bottom surface of the second through-via TVI2 may be lower than a bottom surface of the trench TR.

A power via GVI may be provided between the second through-via TVI2 and the second power line M1_R2. The second through-via TVI2 and the second power line M1_R2 may be electrically connected to each other through the power via GVI.

According to embodiments, a dielectric layer DOD may be provided on the second interlayer insulating layer 120. The dielectric layer DOD may be in direct contact with a top surface of the second interlayer insulating layer 120. The dielectric layer DOD may be selectively disposed only on the top surface of the second interlayer insulating layer 120 excluding the active contacts AC, gate contacts GC, and through-vias TVI1, TVI2, and TVI3. This is so that the dielectric layer DOD may be selectively formed only on the top surface of the insulating layer (i.e., the second interlayer insulating layer 120) except for a conductor.

The dielectric layer DOD may contain "X" and "Y". "X" is an element selected from the group consisting of Si, Ge, Al, Zr, Y, Hf, and Mo, and "Y" may be O or N. The dielectric layer DOD may further contain carbon (C) and/or hydrogen (H). In one embodiment, the dielectric layer DOD may include substantially the same material as that of the third interlayer insulating layer 130. For example, the dielectric layer DOD may include $Al_2O_3$, HfO, $SiO_2$, SiCOH, or SiOC.

Representatively, a top surface of the second through-via TVI2 may be exposed by the dielectric layer DOD. A width (or diameter) of the power via GVI may be greater than a width (or diameter) of the second through-via TVI2. The dielectric layer DOD may guide the power via GVI to accurately connect to the top surface of the second through-via TVI2. That is, the power via GVI may be self-aligned on the second through-via TVI2 by the dielectric layer DOD.

According to embodiments, even when the width (or diameter) of the power via GVI is increased, the dielectric layer DOD may guide the power via GVI to be connected only to the second through-via TVI2. Therefore, the width (or diameter) of the power via GVI according to embodiments may be provided to be larger than the width (or diameter) of the second through-via TVI2. By increasing the width of the power via GVI, even when the power via GVI is misaligned with the second through-via TVI2, the power via GVI may be stably connected to the second through-via TVI2. As a result, reliability of the semiconductor device may be improved.

Lower conductors, such as a first lower conductor LVI1 and a second lower conductor LVI2 buried in the substrate 100 may be provided. The lower conductors may be connected to the through-vias TVI1, TVI2, and TVI3, respectively. For example, first lower conductor LVI1 may be connected to the first through-via TVI1 and second lower conductor LVI2 may be connected the second through-via TVI2. First lower conductor LVI1, second lower conductor LVI2, and a third lower conductor LVI3 (not shown) may vertically overlap the first to third through-vias TVI1, TVI2, and TVI3, respectively.

Representatively referring to FIG. 5F again, the second lower conductor LVI2 may extend vertically from a bottom surface 100*b* of the substrate 100 to a bottom surface of the second through-via TVI2. A top surface of the second lower conductor LVI2 may be in contact with a bottom surface of the second through-via TVI2.

The through-vias TVI1, TVI2, and TVI3 and the lower conductors LVI1, LVI2, and LVI3 may include the same or different metals. For example, the through-vias TVI1, TVI2, and TVI3 may include copper, molybdenum, tungsten, or ruthenium. The lower conductors LVI1, LVI2, and LVI3 may include copper or tungsten. The through-vias TVI1, TVI2, and TVI3 and the lower conductors LVI1, LVI2, and LVI3 may be aligned with each other. That is, center lines of the through-vias TVI1, TVI2, and TVI3 and center lines of the lower conductors LVI1, LVI2, and LVI3 may be aligned with each other.

Widths of the through-vias TVI1, TVI2, and TVI3 may increase in the third direction D3. That is, the widths of the through-vias TVI1, TVI2, and TVI3 may decrease as the through-vias TVI1, TVI2, and TVI3 are closer to the bottom surface 100*b* of the substrate 100. Widths of the lower conductors LVI1, LVI2, and LVI3 may increase as the lower conductors LVI1, LVI2, and LVI3 are closer to the bottom surface 100*b* of the substrate 100. Accordingly, the through-vias TVI1, TVI2, and TVI3 and the lower conductors LVI1, LVI2, and LVI3 may form an hourglass shape.

An upper spacer TSP may be provided on sidewalls of the through-vias TVI1, TVI2, and TVI3. The upper spacer TSP may include a silicon-based insulating material (e.g., a silicon oxide layer, a silicon nitride layer, or a silicon oxynitride layer). A lower spacer LSP may be provided on sidewalls of the lower conductors LVI1, LVI2, and LVI3. The lower spacer LSP may include a silicon-based insulating material (e.g., a silicon oxide layer, a silicon nitride layer, or a silicon oxynitride layer).

A power delivery network layer PDN may be provided on the bottom surface 100*b* of the substrate 100. The power delivery network layer PDN may include a plurality of lower lines electrically connected to the first to third lower conductors LVI1, LVI2, and LVI3. That is, the power delivery network layer PDN may be electrically connected to the first to third power lines M1_R1, M1_R2, and M1_R3.

For example, the power delivery network layer PDN may include a line network for applying a source voltage VSS to the first and third power lines M1_R1 and M1_R3. The power delivery network layer PDN may include a line network for applying a drain voltage VDD to the second power line M1_R2.

Referring back to FIGS. 4 and 5A to 5F, the first metal layer M1 may further include first lines M1_I. The first lines M1_I may extend parallel to each other in the second direction D2.

The first metal layer M1 may further include first vias VI1. The first vias VI1 may be respectively provided under the first lines M1_I of the first metal layer M1. The active contact AC and the first line M1_I may be electrically connected to each other through the first via VI1. The gate contact GC and the first line M1_I may be electrically connected to each other through the first via VI1.

According to an embodiment, the power via GVI may have a first width (or first diameter) WI1. The first via VI1 may have a second width (or second diameter) WI2 (refer to FIG. 5C). The first width WI1 and the second width WI2 may be different from each other. The first width WI1 may be greater than the second width WI2.

The first line M1_I of the first metal layer M1 and the first via VI1 therebelow may be formed through separate processes. That is, each of the first line M1_I and the first via VI1 of the first metal layer M1 may be formed through a single damascene process. The semiconductor device according to the present embodiment may be formed using a process of less than 20 nm.

A second metal layer M2 may be provided in the fourth interlayer insulating layer 140. The second metal layer M2 may include a plurality of second lines M2_I. Each of the second lines M2_I of the second metal layer M2 may have a line shape or a bar shape extending in the first direction D1. That is, the second lines M2_I may extend parallel to each other in the first direction D1.

The second metal layer M2 may further include second vias VI2 respectively provided under the second lines M2_I. The first line M1_I of the first metal layer M1 and the second line M2_I of the second metal layer M2 may be electrically connected to each other through the second via VI2. For example, the second line M2_I of the second metal layer M2 and the second via VI2 therebelow may be formed together through a dual damascene process.

The first line M1_I of the first metal layer M1 and the second line M2_I of the second metal layer M2 may include the same or different conductive materials. For example, the first line M1_I of the first metal layer M1 and the second line M2_I of the second metal layer M2 may include one metal material selected from aluminum, copper, tungsten, molybdenum, ruthenium, and cobalt. Although not shown, metal layers (e.g., M3, M4, M5, etc.) stacked on the fourth insulating interlayer 140 may be additionally disposed. Each of the stacked metal layers may include lines for routing between cells.

The through-vias TVI1, TVI2, and TVI3 and the lower conductors LVI1, LVI2, and LVI3 (not shown) according to embodiments may be individually formed through different processes. That is, a vertical contact extending from the power delivery network layer PDN to the first metal layer M1 may be divided into two parts of the through-vias TVI1, TVI2, and TVI3. The lower conductors LVI1, LV12, and LVI3 and may be formed independently. As a result, according to the embodiment, a metal may be well filled in the vertical contacts TVI and LVI having a high aspect ratio, and thus reliability of the device may be improved.

The vertical contacts TVI and LVI may be divided into the through-via TVI and the lower conductor LVI and may be formed on the front and rear surfaces of the substrate 100, respectively. Accordingly, an area required for forming the vertical contact may be reduced. As a result, a size of the tap cell may be reduced.

The tap cells TC1 and TC2 according to the embodiments may be provided with the first pitch, which is an interval between the gate electrodes GE. That is, the tap cells TC1 and TC2 may have a very small size. As the sizes of the tap cells TC1 and TC2 are reduced, an area in which the logic cells may be disposed in the logic die may further increase. As a result, embodiments may improve the integration of semiconductor devices.

FIGS. 6A to 14 are cross-sectional views illustrating a method of manufacturing a semiconductor device according to embodiments. In detail, FIGS. 6A, 7A, 8A, 9A, 10A, 11A, and 12A are cross-sectional views corresponding to line A-A' of FIG. 4. FIGS. 8B, 9B, 10B, 11B, and 12B are cross-sectional views corresponding to line B-B' of FIG. 4. FIGS. 8C and 9C are cross-sectional views corresponding to lines D-D' in FIG. 4. FIGS. 6B, 7B, 10C, 11C, and 12C are cross-sectional views corresponding to lines E-E' in FIG. 4. FIGS. 11D, 12D, 13, and 14 are cross-sectional views corresponding to line F-F' of FIG. 4.

Figure 6A:
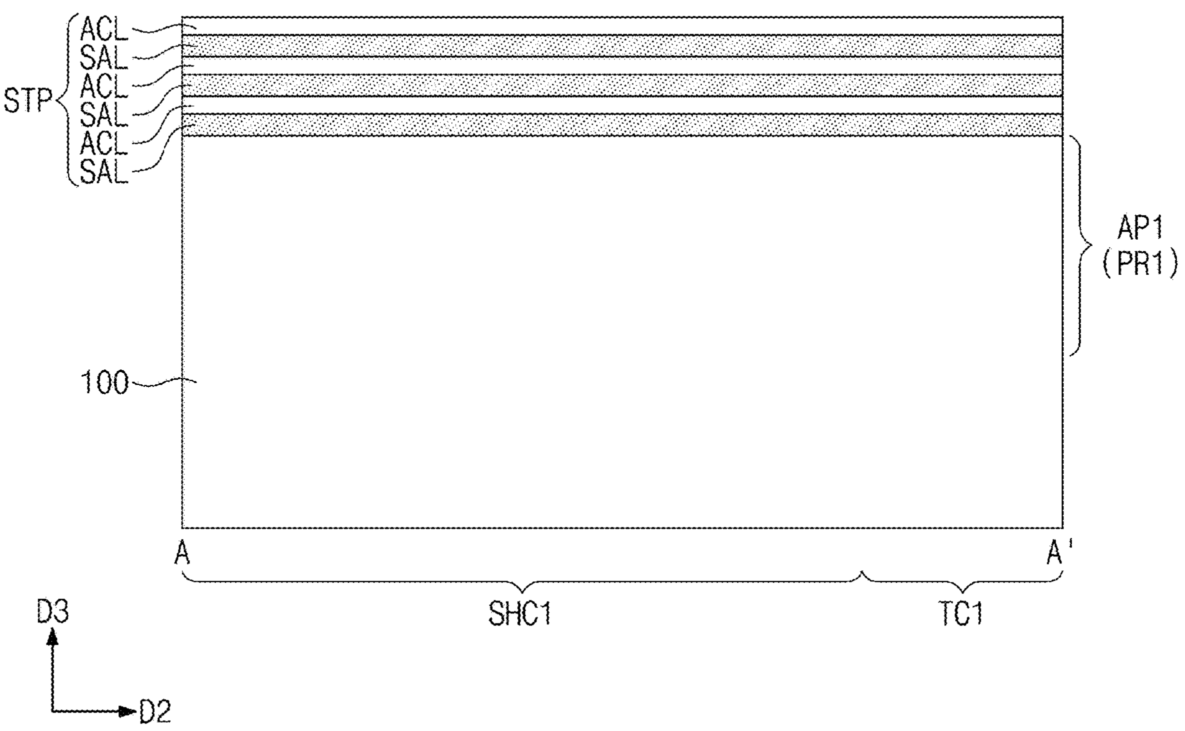
FIGS. 6A to 14 are cross-sectional views illustrating a method of manufacturing a semiconductor device according to embodiments.
Figure 6B:
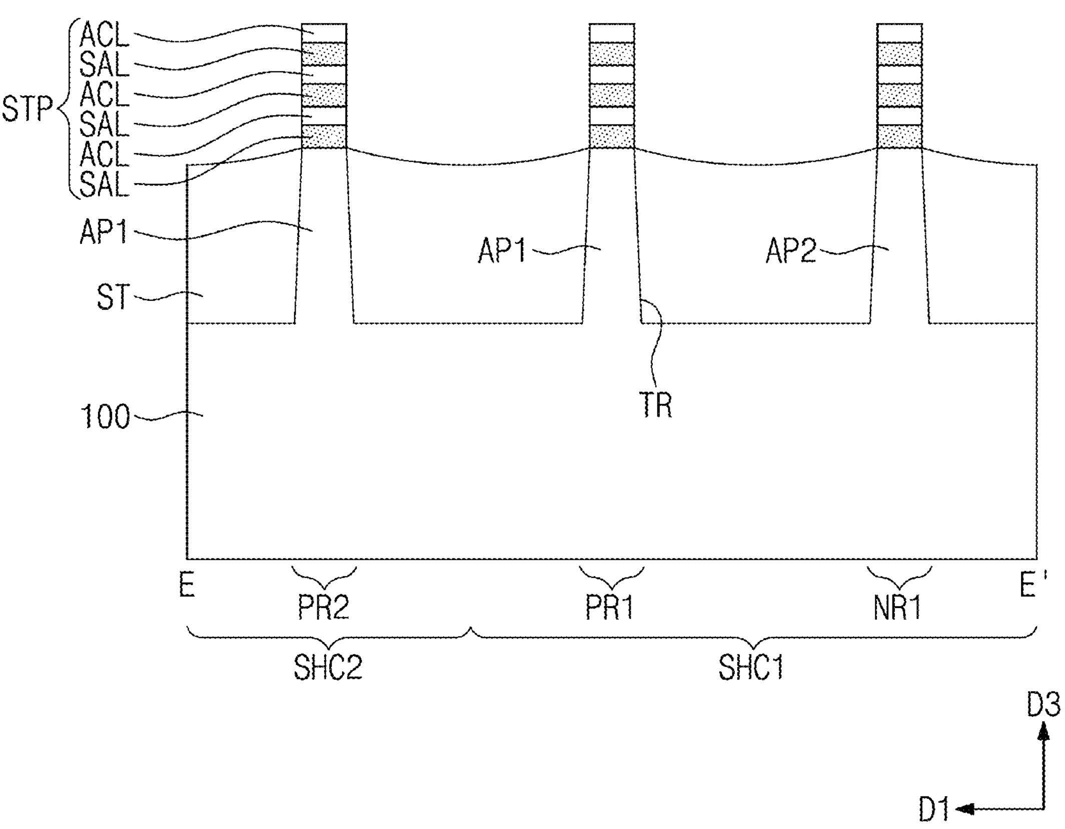

Referring to FIGS. 6A and 6B, a substrate 100 including first and second PMOSFET regions PR1 and PR2 and first and second NMOSFET regions NR1 and NR2 may be provided. First semiconductor layers ACL and second semiconductor layers SAL may be alternately stacked on the substrate 100. The first semiconductor layers ACL may include one of silicon (Si), germanium (Ge), and silicon-germanium (SiGe), and the second semiconductor layers SAL may include silicon (Si), germanium (Ge) and silicon-germanium (SiGe).

The second semiconductor layer SAL may include a material having an etch selectivity with respect to the first semiconductor layer ACL. For example, the first semiconductor layers ACL may include silicon (Si), and the second semiconductor layers SAL may include silicon-germanium (SiGe). A concentration of germanium (Ge) in each of the second semiconductor layers SAL may be 10 at % to 30 at %.

Mask patterns may be formed on the first and second PMOSFET regions PR1 and PR2 and the first and second NMOSFET regions NR1 and NR2 of the substrate 100, respectively. The mask pattern may have a line shape or a bar shape extending in a second direction D2.

A patterning process may be performed using the mask patterns as an etch mask to form a trench TR defining the first and second active patterns AP1 and AP2. The first active pattern AP1 may be formed on each of the first and second PMOSFET regions PR1 and PR2. The second active pattern AP2 may be formed on each of the first and second NMOSFET regions NR1 and NR2. When viewed from a plan view, the first and second active patterns AP1 and AP2 may have a line shape extending parallel to each other in the second direction D2.

A stacked pattern STP may be formed on each of the first and second active patterns AP1 and AP2. The stacked pattern STP may include first semiconductor layers ACL and second semiconductor layers SAL that are alternately stacked with each other. The stacked pattern STP may be formed with the first and second active patterns AP1 and AP2 during the patterning process.

An isolation layer ST may be formed to fill the trench TR. In detail, an insulating layer may be formed on the entire surface of the substrate 100 to cover the first and second active patterns AP1 and AP2 and the stacked patterns STP. The isolation layer ST may be formed by recessing the insulating layer until the stacked patterns STP are exposed.

The device isolation layer ST may include an insulating material such as a silicon oxide layer. The stacked patterns STP may be exposed on the device isolation layer ST. That is, the stacked patterns STP may vertically protrude from the device isolation layer ST.

Figure 7A:
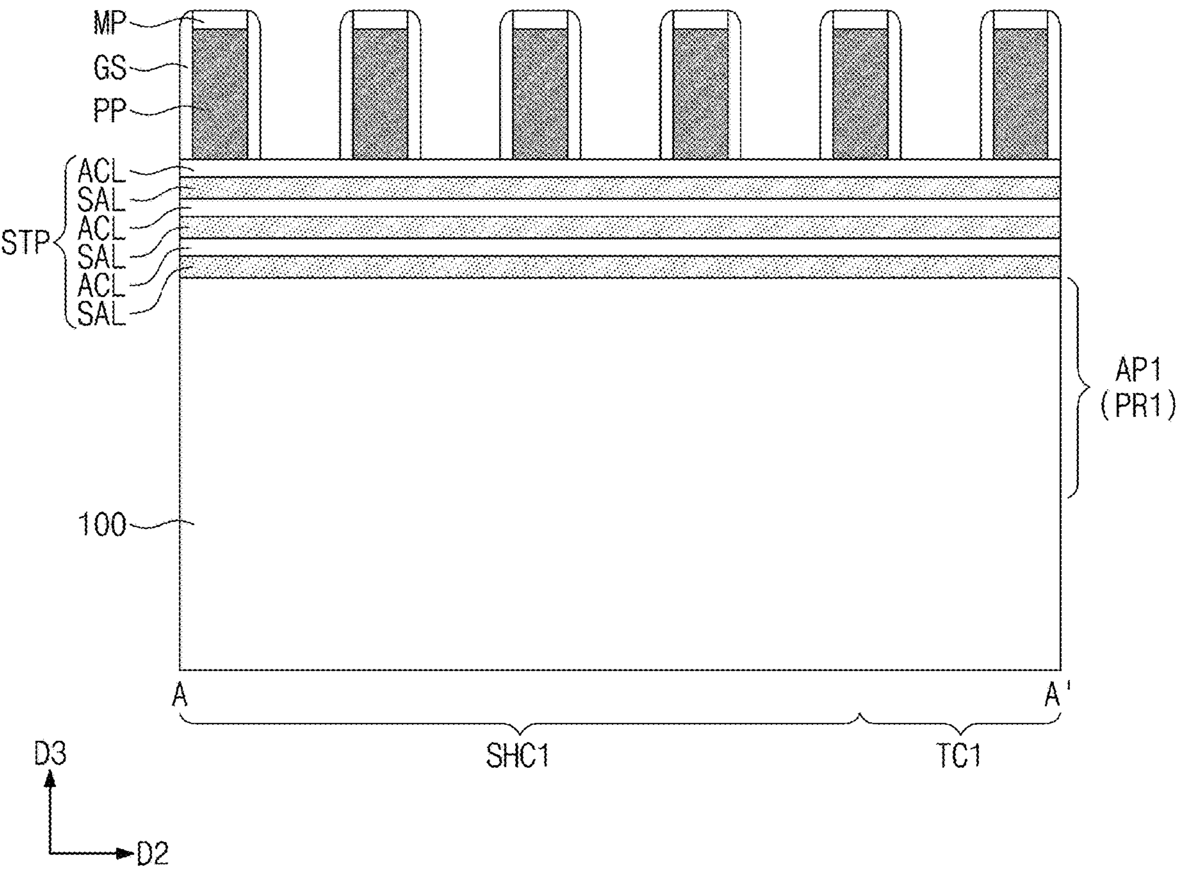
Figure 7B:
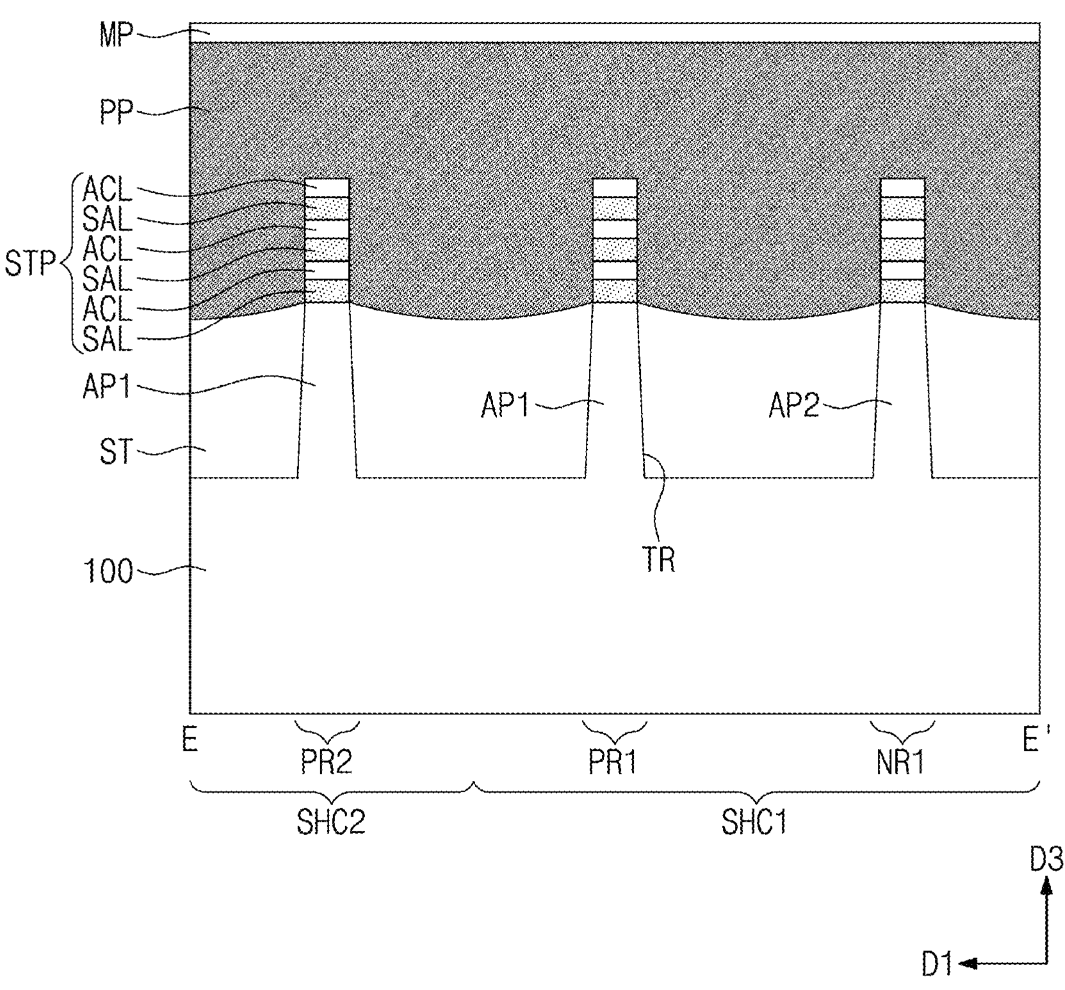

Referring to FIGS. 7A and 7B, sacrificial patterns PP crossing the stacked patterns STP may be formed on the substrate 100. Each of the sacrificial patterns PP may be formed in a line shape or bar shape extending in a first direction D1. The sacrificial patterns PP may be arranged in the second direction D2 by a first pitch.

In detail, forming the sacrificial patterns PP may include forming a sacrificial layer on the entire surface of the substrate 100, forming hard mask patterns MP on the sacrificial layer, and patterning the sacrificial layer using the hard mask patterns MP as an etching mask. The sacrificial layer may include polysilicon.

A pair of gate spacers GS may be formed on both sidewalls of each of the sacrificial patterns PP. Forming the gate spacers GS may include conformally forming a gate spacer layer on the entire surface of the substrate 100 and anisotropically etching the gate spacer layer. The gate spacer layer may include at least one of SiCN, SiCON, and SiN. As another example, the gate spacer layer may be a multi-layer including at least two of SiCN, SiCON, and SiN.

Figure 8A:
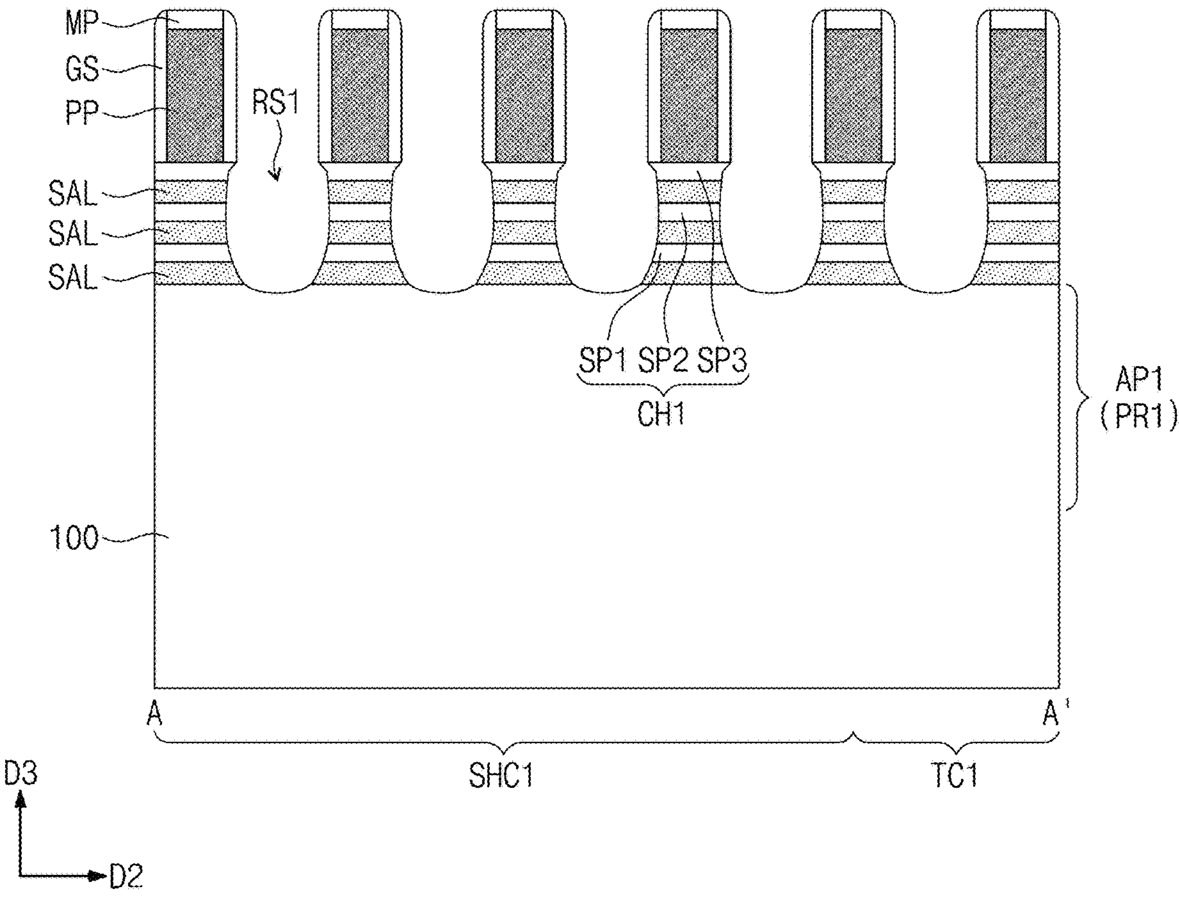
Figure 8B:
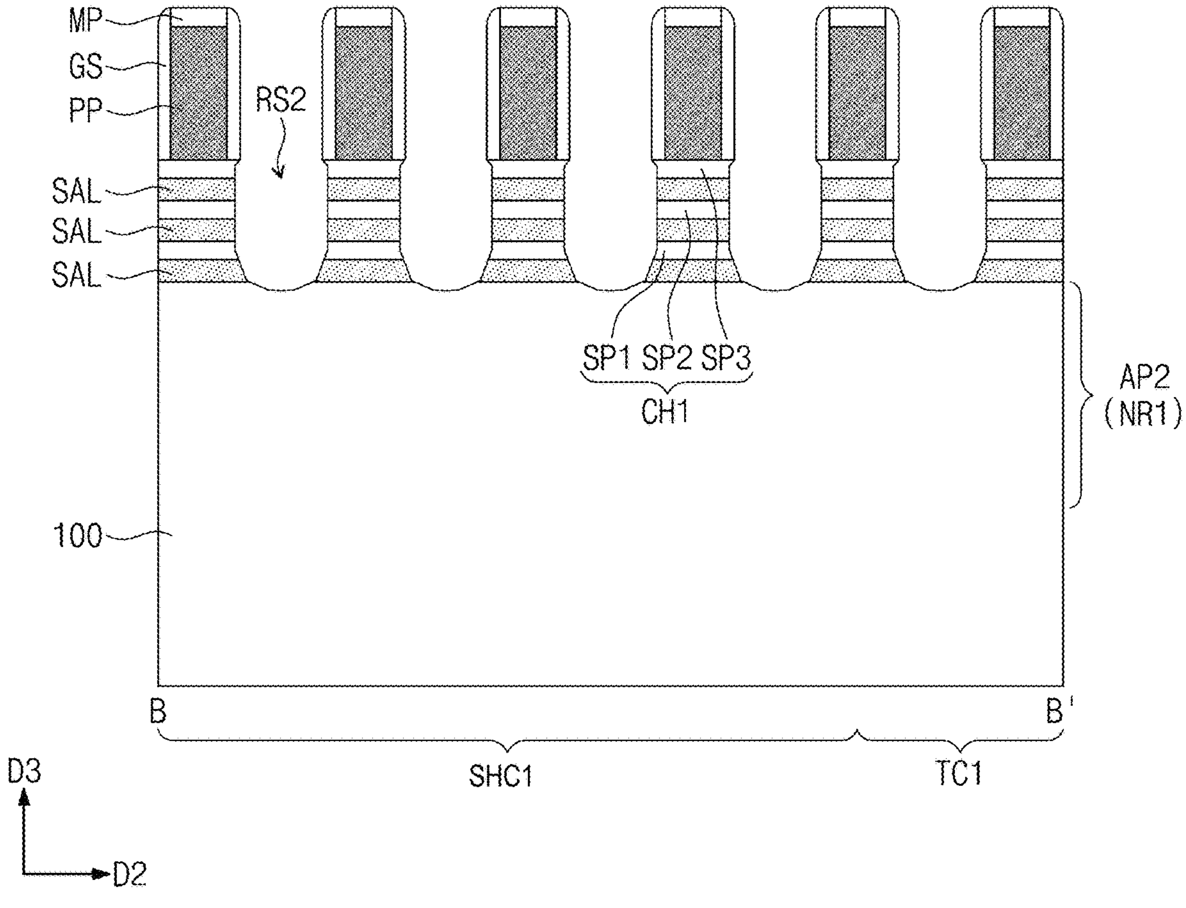
Figure 8C:
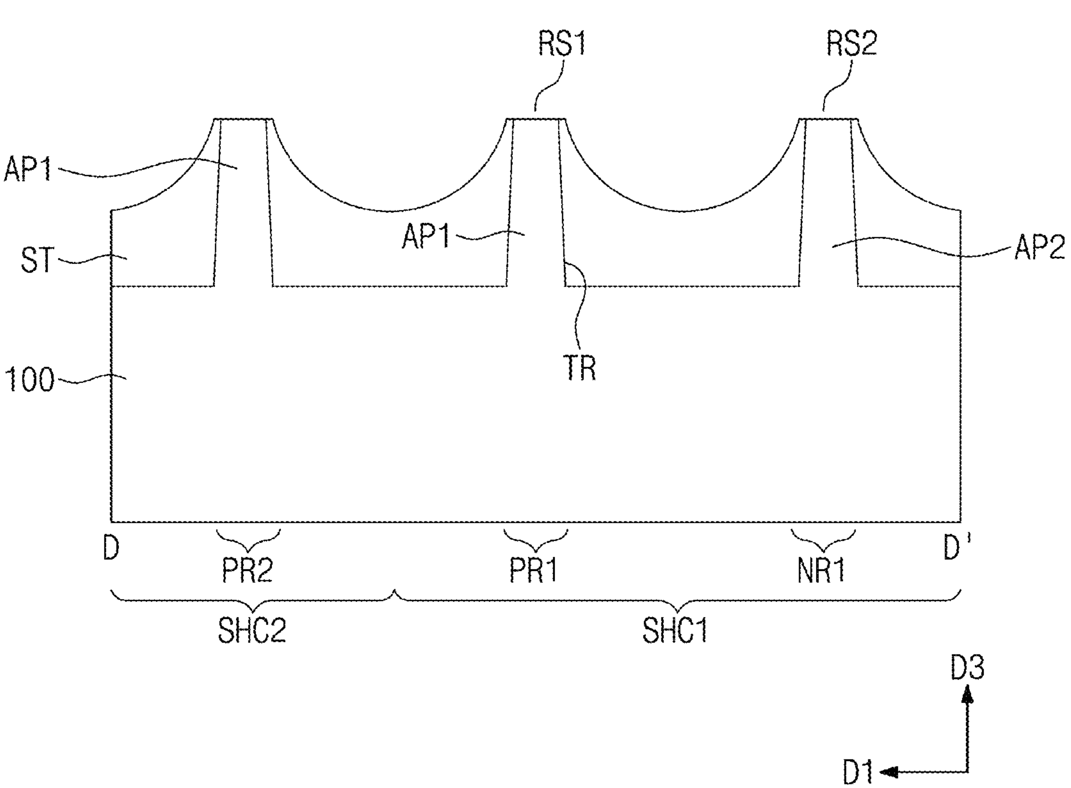

Referring to FIGS. 8A to 8C, first recesses RS1 may be formed in the stacked pattern STP on the first active pattern AP1. Second recesses RS2 may be formed in the stacked pattern STP on the second active pattern AP2. While forming the first and second recesses RS1 and RS2, the device isolation layer ST on both sides of each of the first and second active patterns AP1 and AP2 may be further recessed (refer to FIG. 8C).

In detail, the first recesses RS1 may be formed by etching the stacked pattern STP on the first active pattern AP1 using the hard mask patterns MA and the gate spacers GS as an etch mask. The first recess RS1 may be formed between a pair of sacrificial patterns PP. The second recesses RS2 in the stacked pattern STP on the second active pattern AP2 may be formed in the same manner as forming the first recesses RS1.

From the first semiconductor layers ACL, first to third semiconductor patterns SP1, SP2, and SP3 sequentially stacked between adjacent first recesses RS1 may be formed, respectively. From the first semiconductor layers ACL, first to third semiconductor patterns SP1, SP2, and SP3 sequentially stacked between adjacent second recesses RS2 may be formed, respectively. The first to third semiconductor patterns SP1, SP2, and SP3 between the adjacent first recesses RS1 may constitute a first channel pattern CH1. The first to third semiconductor patterns SP1, SP2, and SP3 between the adjacent second recesses RS2 may constitute a second channel pattern CH2.

Figure 9A:
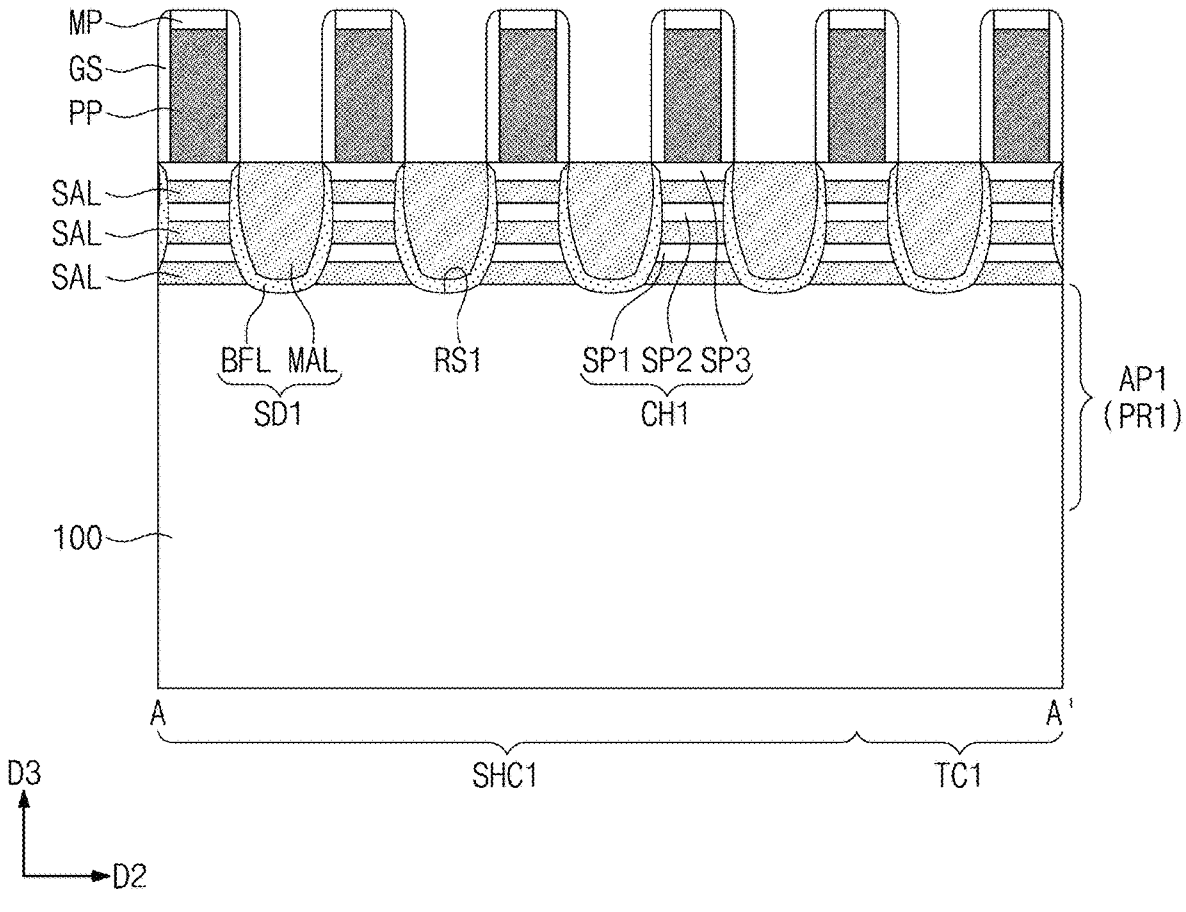
Figure 9B:
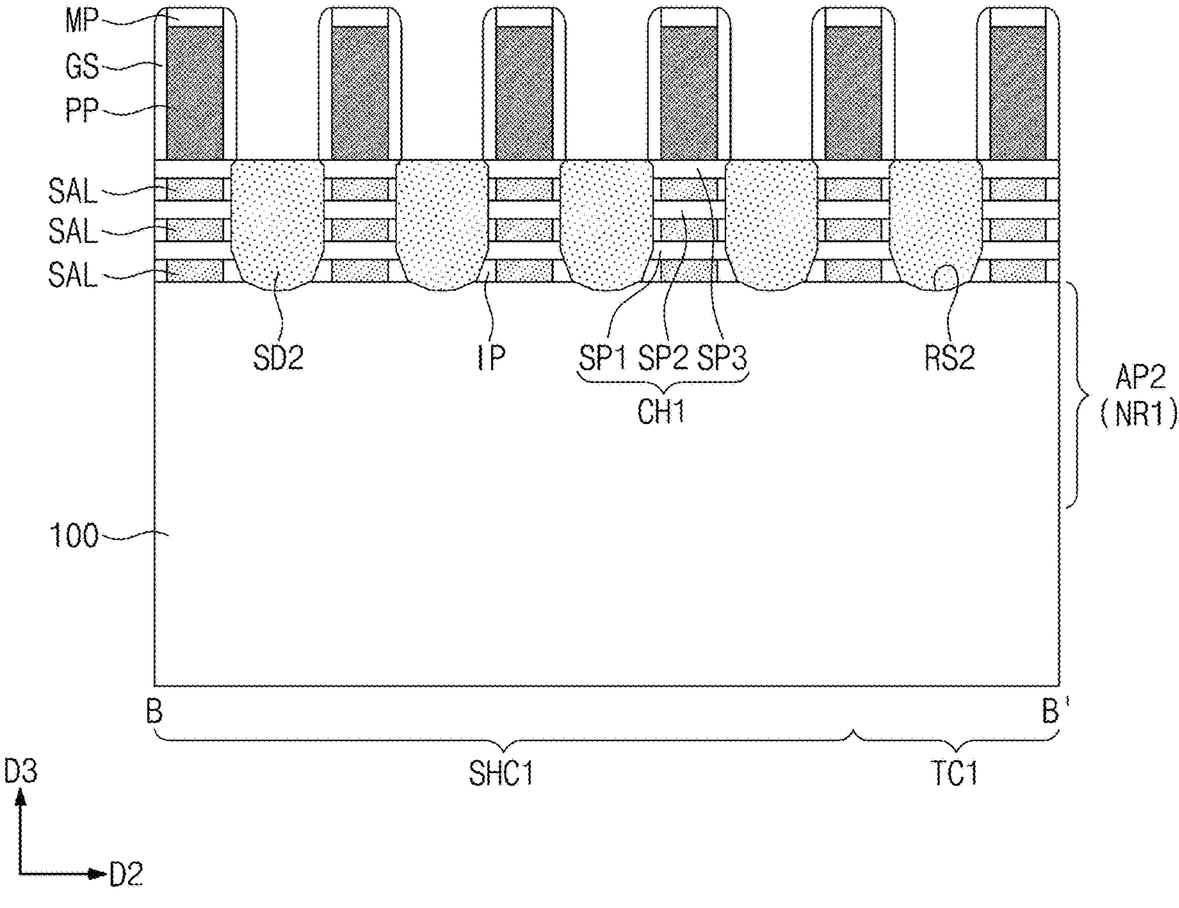
Figure 9C:
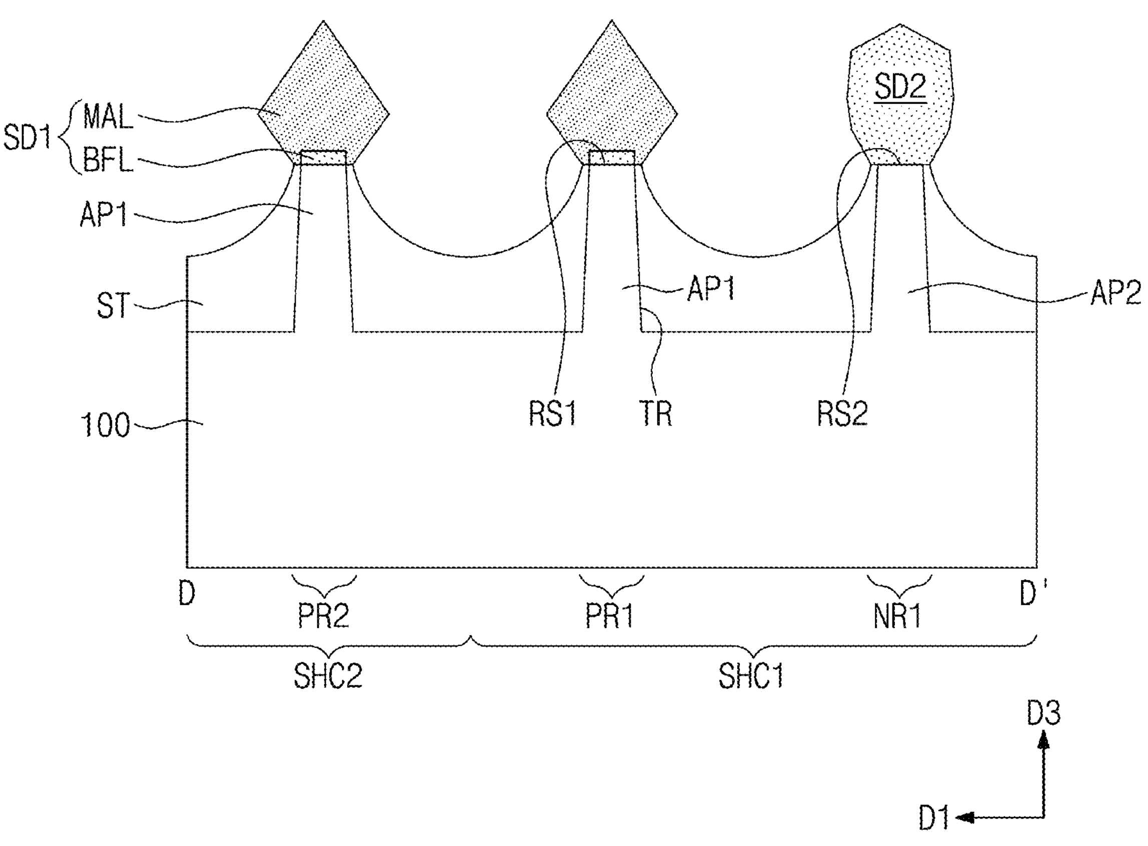

Referring to FIGS. 9A to 9C, first source/drain patterns SD1 may be formed in the first recesses RS1, respectively. In detail, a buffer layer BFL may be formed by performing a first SEG process using an inner wall of the first recess RS1 as a seed layer. The buffer layer BFL may be grown using the substrate 100 and the first to third semiconductor patterns SP1, SP2, and SP3 exposed by the first recess RS1 as seeds. For example, the first SEG process may include a chemical vapor deposition (CVD) process or a molecular beam epitaxy (MBE) process.

The buffer layer BFL may include a semiconductor element (e.g., SiGe) having a greater lattice constant than a lattice constant of the semiconductor element of the substrate 100. The buffer layer BFL may contain germanium (Ge) at a relatively low concentration. In another embodiment, the buffer layer BFL may contain only silicon (Si) excluding germanium (Ge). A concentration of germanium (Ge) in the buffer layer BFL may be 0 at % to 10 at %.

A main layer MAL may be formed by performing the second SEG process on the buffer layer BFL. The main layer MAL may be formed to completely or almost completely fill the first recess RS1. The main layer MAL may contain germanium (Ge) at a relatively high concentration. For example, a concentration of germanium (Ge) in the main layer MAL may be 30 at % to 70 at %.

In one embodiment, a capping layer may be formed by performing a third SEG process on the main layer MAL. The capping layer may include silicon (Si). A concentration of silicon (Si) in the capping layer may be 98 at % to 100 at %.

While forming the buffer layer BFL and the main layer MAL, impurities (e.g., boron, gallium, or indium) that cause the first source/drain pattern SD1 to have a p-type may be implanted in-situ. As another example, impurities may be implanted into the first source/drain pattern SD1 after the first source/drain pattern SD1 is formed.

Second source/drain patterns SD2 may be formed in the second recesses RS2, respectively. In detail, the second source/drain pattern SD2 may be formed by performing a selective epitaxial growth (SEG) process using an inner wall of the second recess RS2 as a seed layer. For example, the second source/drain pattern SD2 may include the same semiconductor element (e.g., Si) as the substrate 100.

While forming the second source/drain pattern SD2, impurities (e.g., phosphorus, arsenic, or antimony) that cause the second source/drain pattern SD2 to have an n-type may be implanted in-situ. As another example, impurities may be implanted into the second source/drain pattern SD2 after the second source/drain pattern SD2 is formed.

In one embodiment, before forming the second source/drain pattern SD2, a portion of the second semiconductor layer SAL exposed through the second recess RS2 may be replaced with an insulating material to form an inner spacer IP. As a result, the inner spacers IP may be respectively formed between the second source/drain pattern SD2 and the second semiconductor layers SAL.

Figure 10A:
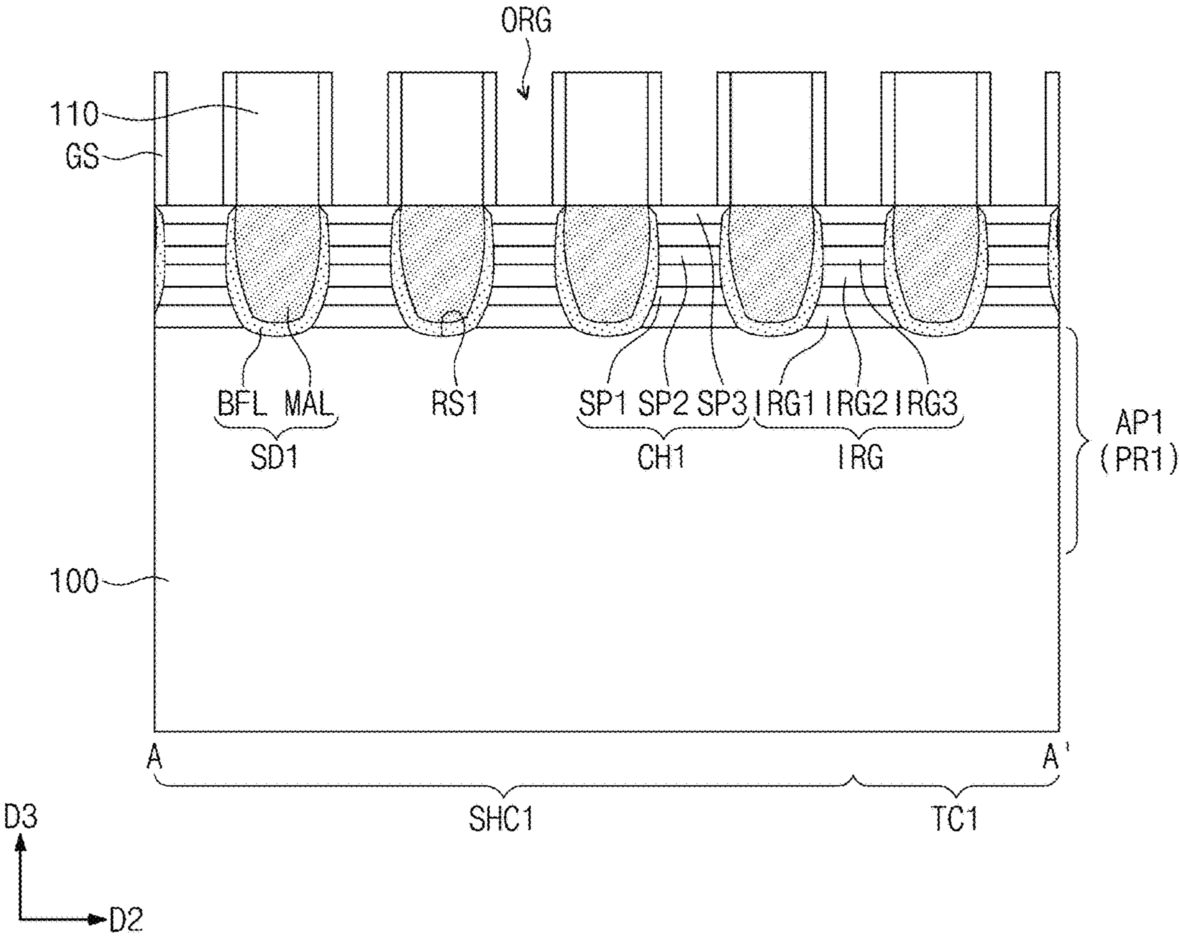
Figure 10B:
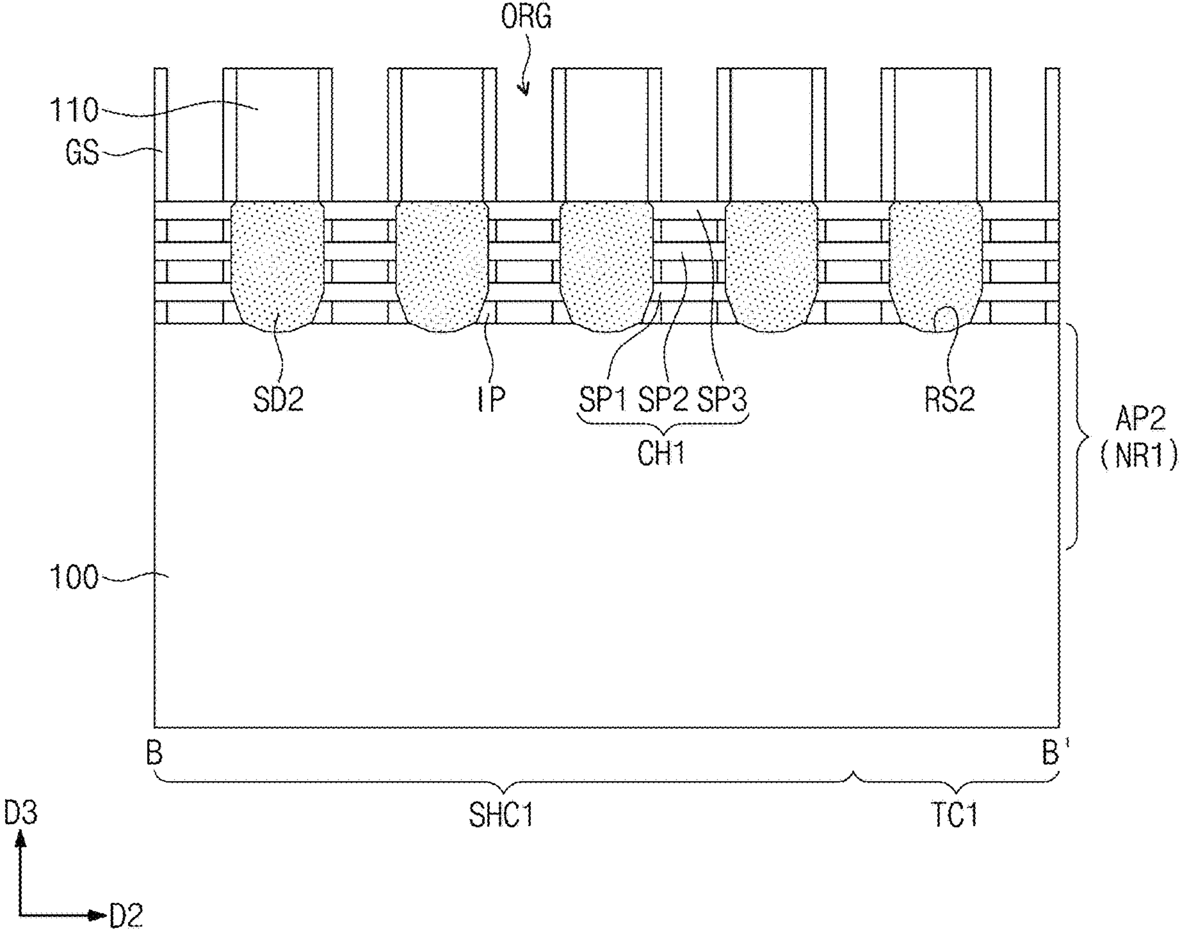
Figure 10C:
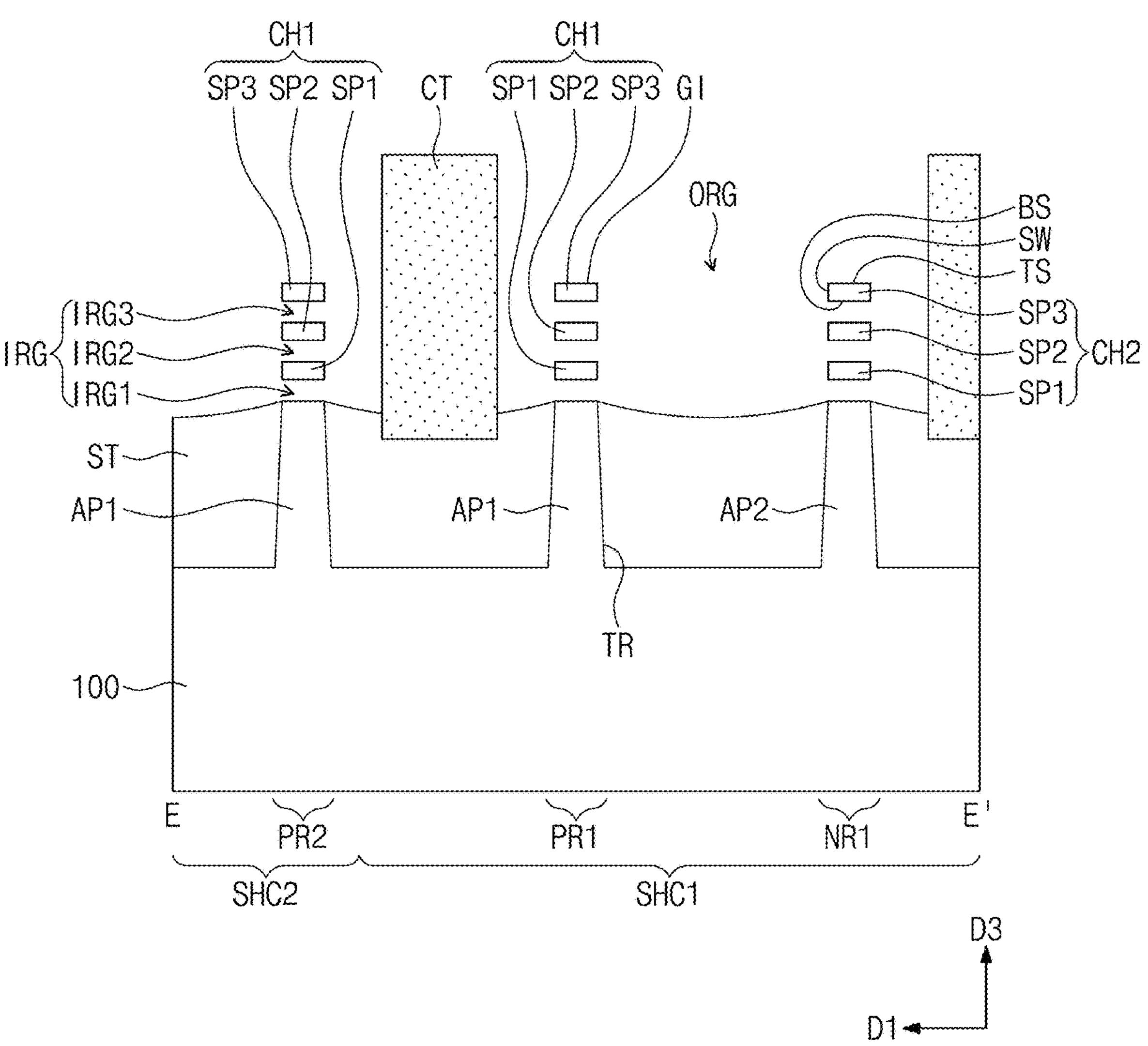
Figure 11A:
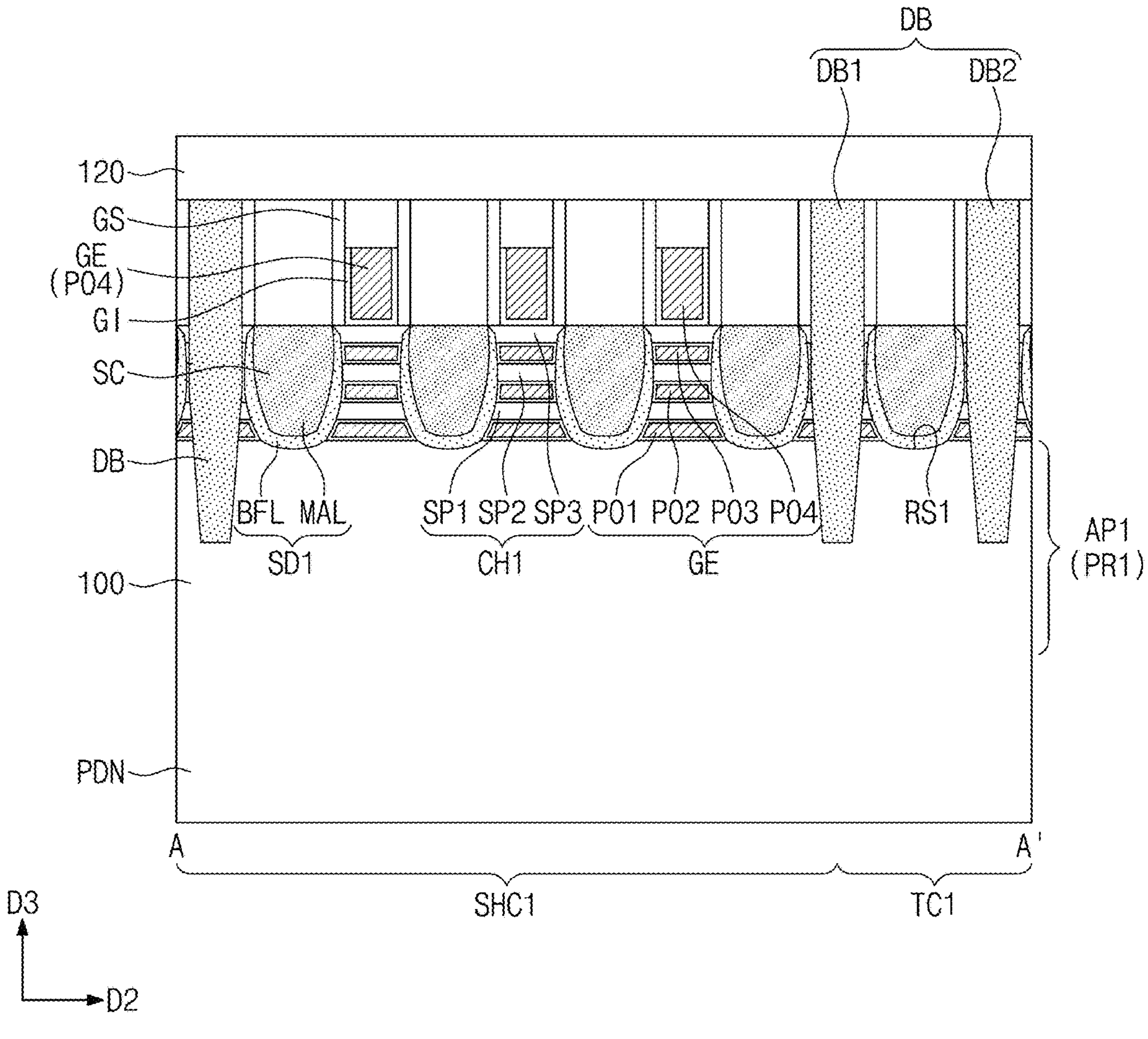
Figure 11B:
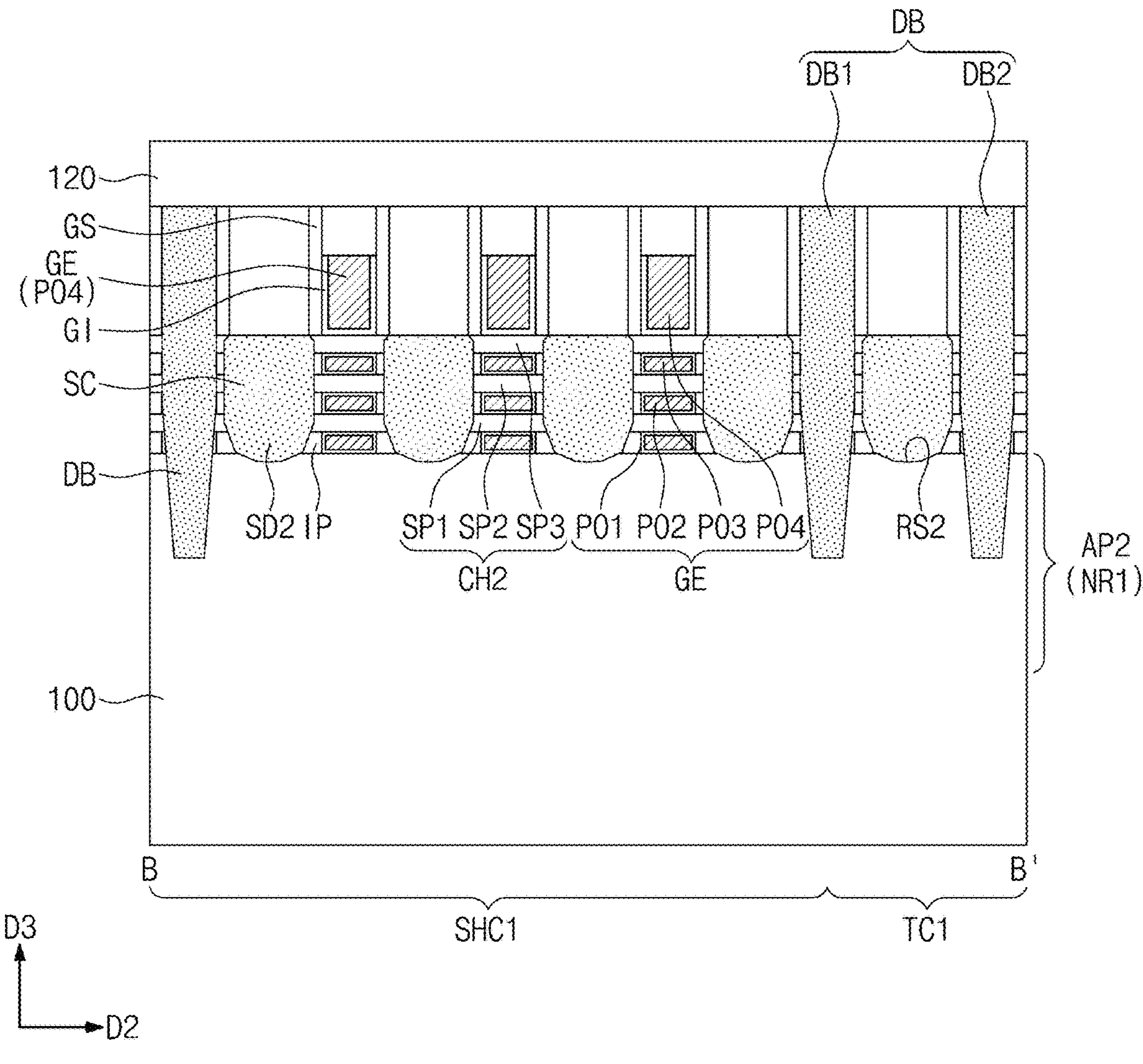
Figure 11C:
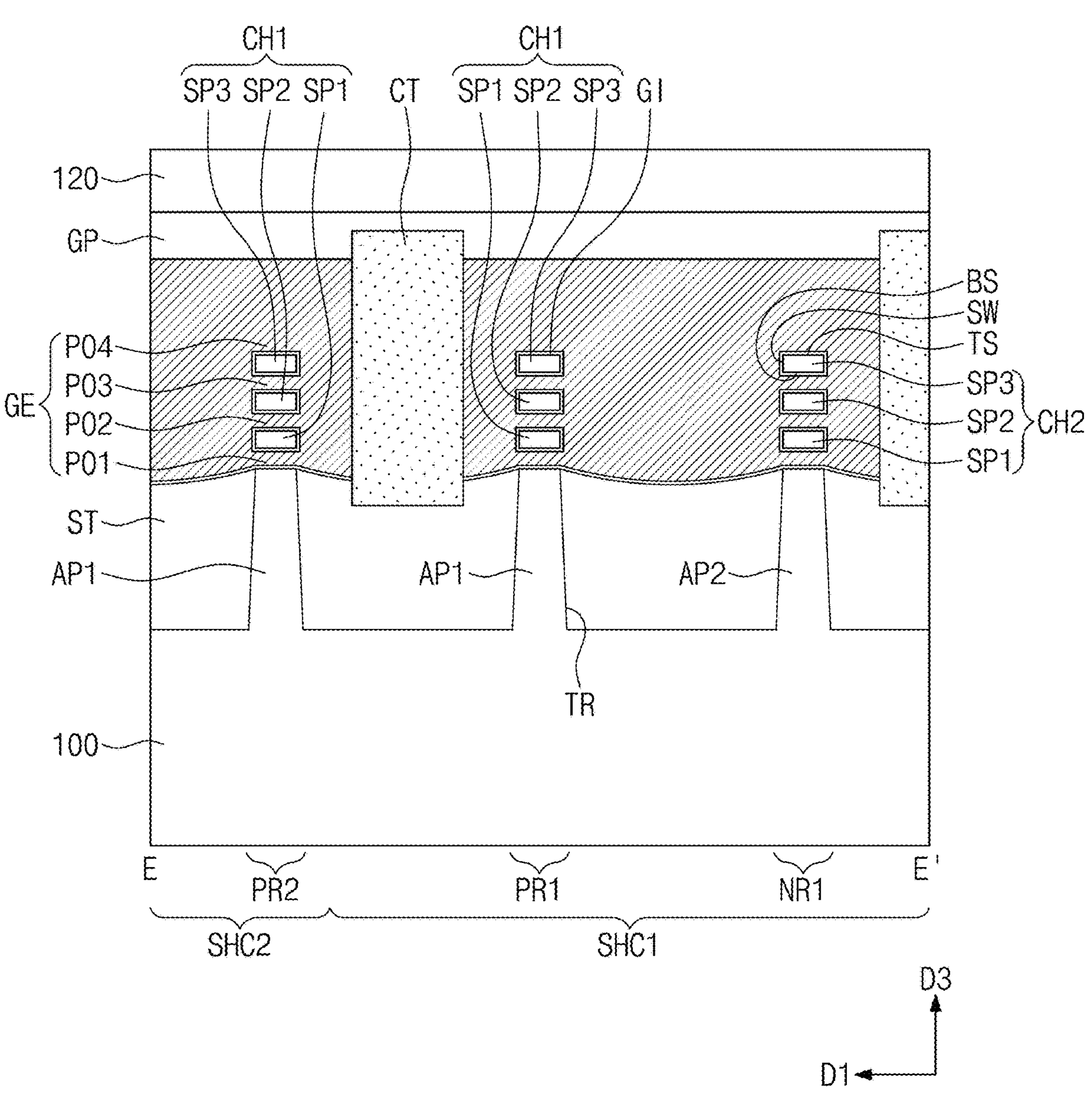
Figure 11D:
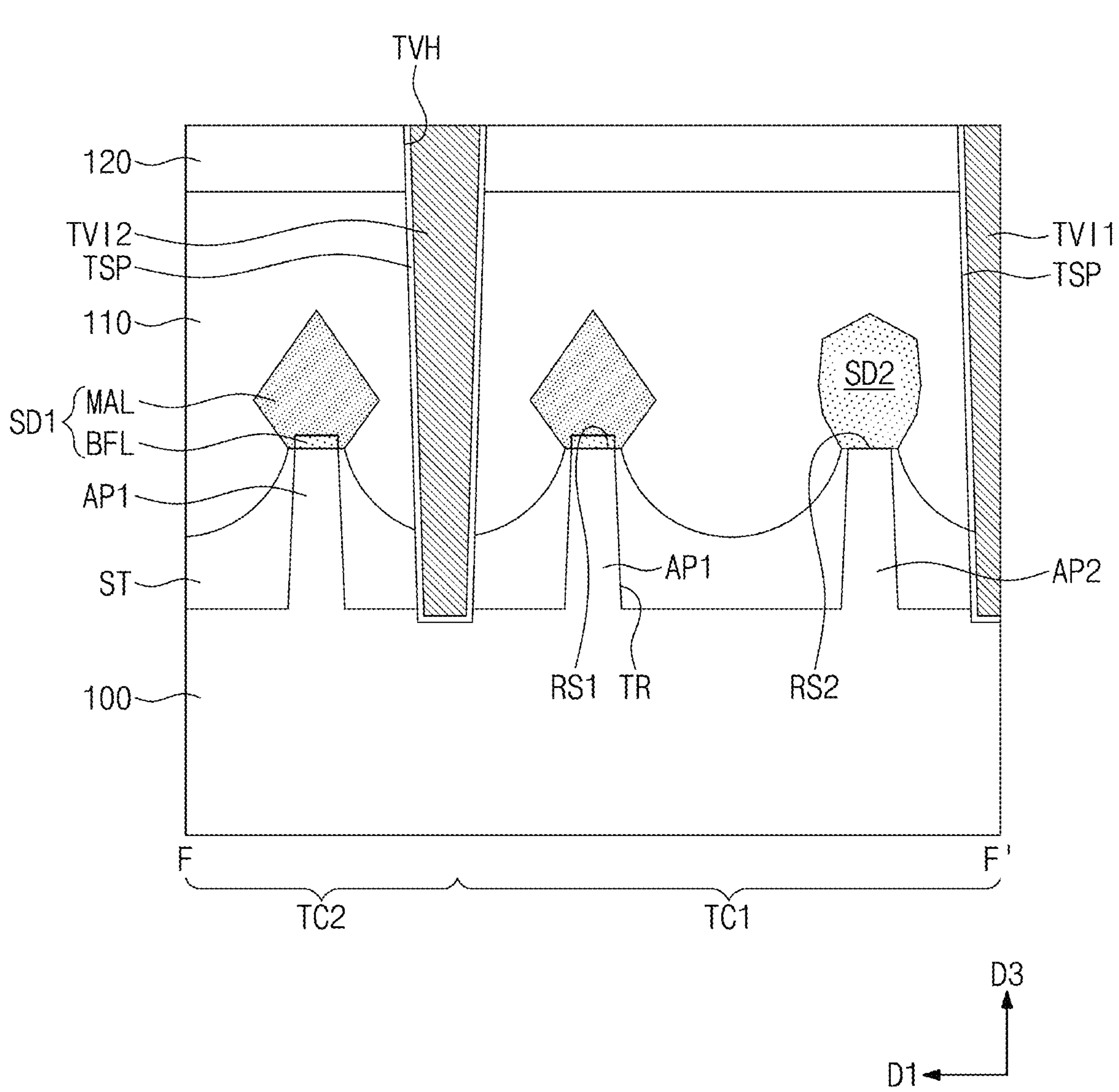

Referring to FIGS. 10A to 10C, a first interlayer insulating layer 110 covering the first and second source/drain patterns SD1 and SD2, the hard mask patterns MP, and the gate spacers GS may be formed. For example, the first interlayer insulating layer 110 may include a silicon oxide layer.

The first interlayer insulating layer 110 may be planarized until top surfaces of the sacrificial patterns PP are exposed. Planarizing the first interlayer insulating layer 110 may be performed using an etch back or chemical mechanical polishing (CMP) process. During the planarization process, all of the hard mask patterns MP may be removed. As a result, a top surface of the first interlayer insulating layer 110 may be coplanar with top surfaces of the sacrificial patterns PP and the surfaces of the gate spacers GS.

A region of the sacrificial pattern PP may be selectively opened using photolithography. For example, one region of the sacrificial pattern PP on a boundary between the first and second single height cells SHC1 and SHC2 may be selectively opened. A region of the open sacrificial pattern PP may be selectively etched and removed. A gate cutting pattern CT may be formed by filling an insulating material in a space from which the sacrificial pattern PP is removed (refer to FIG. 10C).

The exposed sacrificial patterns PP may be selectively removed. By removing the sacrificial patterns PP, an outer region ORG exposing the first and second channel patterns CH1 and CH2 may be formed (refer to FIG. 10C). Removing the sacrificial patterns PP may include wet etching using an etchant that selectively etches polysilicon.

The second semiconductor layers SAL exposed through the outer region ORG may be selectively removed to form inner regions IRG (refer to FIG. 10C). In detail, an etching process for selectively etching the second semiconductor layers SAL may be performed to remove only the second semiconductor layers SAL while leaving the first to third semiconductor patterns SP1, SP2, and SP3 intact. The etching process may have a high etching rate for silicon-germanium having a relatively high germanium concentration. For example, the etching process may have a high etching rate for silicon-germanium having a germanium concentration greater than 10 at %.

During the etching process, the second semiconductor layers SAL on the first and second PMOSFET regions PR1 and PR2 and the first and second NMOSFET regions NR1 and NR2 may be completely removed. The etching process may be wet etching. The etching material used in the etching process may quickly remove the second semiconductor layer SAL having a relatively high germanium concentration. Meanwhile, the first source/drain pattern SD1 on the first and second PMOSFET regions PR1 and PR2 may be protected during the etching process due to the buffer layer BFL having a relatively low germanium concentration.

Referring back to FIG. 10C, as the second semiconductor layers SAL are selectively removed, the first to third semiconductor patterns SP1, SP2, and SP3 stacked on the first and second active patterns AP1 and AP2 may remain, respectively. First to third inner regions IRG1, IRG2, and IRG3 may be respectively formed through regions where the second semiconductor layers SAL are removed.

In detail, the first inner region IRG1 may be formed between the active pattern AP1 or AP2 and the first semiconductor pattern SP1, the second inner region IRG2 may be formed between the first semiconductor pattern SP1, and the second semiconductor pattern SP2, and the third inner region IRG3 may be formed between the second semiconductor pattern SP2 and third semiconductor pattern SP3.

Referring to FIGS. 11A to 11D, a gate insulating layer GI may be conformally formed on the exposed first to third semiconductor patterns SP1, SP2, and SP3. A gate electrode GE may be formed on the gate insulating layer GI. The gate electrode GE may include first to third inner electrodes PO1, PO2, and PO3 respectively formed in the first to third inner regions IRG1, IRG2, and IRG3, and an outer electrode PO4 formed in the outer region ORG.

When the gate electrode GE is recessed, a height of the gate electrode GE may be reduced. While the gate electrode GE is recessed, upper portions of the gate cutting patterns CT may also be slightly recessed. A gate capping pattern GP may be formed on the recessed gate electrode GE.

A separation structure DB may be formed at a boundary between the cells. The separation structure DB may pass through the gate electrode GE and extend into the active pattern AP1 or AP2. The separation structure DB may include an insulating material such as a silicon oxide layer or a silicon nitride layer. A second interlayer insulating layer 120 may be formed on the first interlayer insulating layer 110. The second interlayer insulating layer 120 may include a silicon oxide layer.

Referring back to FIG. 11D, through holes TVH exposing the substrate 100 may be formed through the first and second interlayer insulating layers 110 and 120. For example, at least one through hole TVH may be formed at a boundary between the first and second tap cells TC1 and TC2. The through hole TVH may be formed between a pair of first active patterns AP1. The through hole TVH may expose a bottom of the trench TR between the pair of first active patterns AP1. A width of the through hole TVH may decrease as the through hole TVH approaches the substrate 100.

An upper spacer TSP may be formed on an inner wall of the through hole TVH. The upper spacer TSP may be formed of a silicon-based insulating material. Through-vias TVI1, TVI2, and TVI3 may be formed by filling metal in the through holes TVH.

Referring to FIGS. 12A to 12D, active contacts AC electrically connected to the first and second source/drain patterns SD1 and SD2 may be formed through the second interlayer insulating layer 120 and the first interlayer insulating layer 110. A gate contact GC electrically connected to the gate electrode GE may be formed through the second interlayer insulating layer 120 and the gate capping pattern GP.

A dielectric layer DOD may be selectively formed on the top surface of the second interlayer insulating layer 120. The dielectric layer DOD may not be formed on top surfaces of the active contacts AC, the gate contacts GC, and the first to third through-vias TVI1, TVI2, and TVI3. A third interlayer insulating layer 130 may be formed on the dielectric layer DOD. The third interlayer insulating layer 130 may include a silicon oxide layer containing silicon (Si) and oxygen (O). The third interlayer insulating layer 130 may further contain carbon (C) and hydrogen (H).

A first metal layer M1 may be formed in the third interlayer insulating layer 130. The first metal layer M1 may include first to third power lines M1_R1, M1_R2, and M1_R3 electrically connected to the first to third through-vias TVI1, TVI2, and TVI3, respectively. The first metal layer M1 may further include a first line M1_I electrically connected to at least one active contact AC or at least one gate contact GC.

A power via GVI connecting the power lines M1_R1 to M1_R3 and the through-vias TVI1, TVI2, and TVI3 may be formed. The power via GVI may be formed in a self-aligned manner by the dielectric layer DOD. A first via VI1 may be formed to be in connect with the active contact AC or gate contact GC and the first line M1_I. The first via VI1 may also be formed in a self-aligned manner by the dielectric layer DOD.

Then, as described above with reference to FIGS. 4 and 5A to 5F, a fourth interlayer insulating layer 140 may be formed on the third interlayer insulating layer 130. A second metal layer M2 may be formed in the fourth interlayer insulating layer 140. The second metal layer M2 may include a second line M2_I electrically connected to the first line M1_I. Thereafter, additional metal layers M3, M4, M5, etc. may be further formed on the second metal layer M2 through an additional BEOL process.

Figure 13:
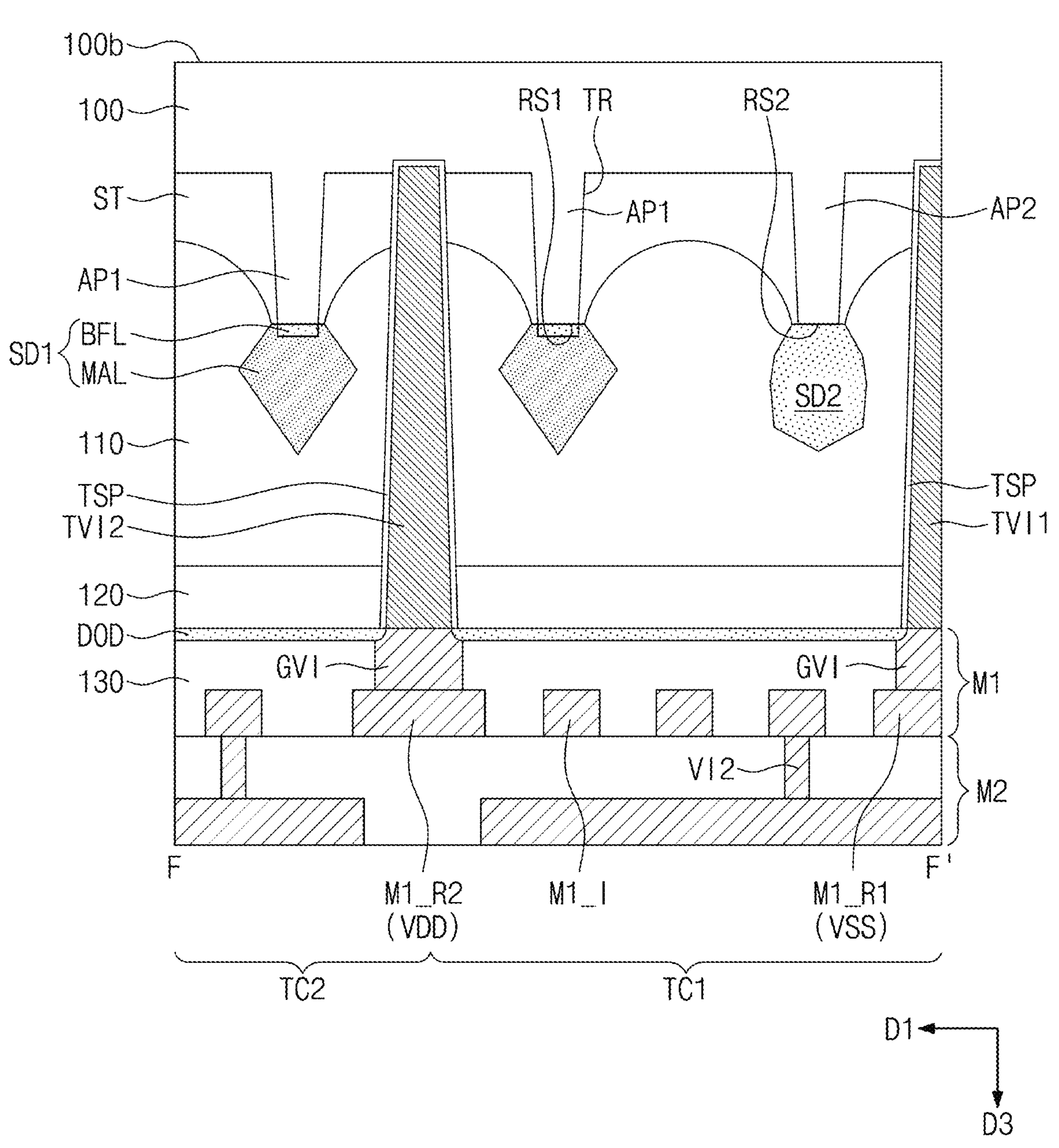

Referring to FIG. 13, after the BEOL process is completed, the substrate 100 may be turned over so that a bottom surface 100*b* of the substrate 100 is exposed. A planarization process may be performed on the bottom surface 100*b* of the substrate 100 to reduce a thickness of the substrate 100.

Figure 14:
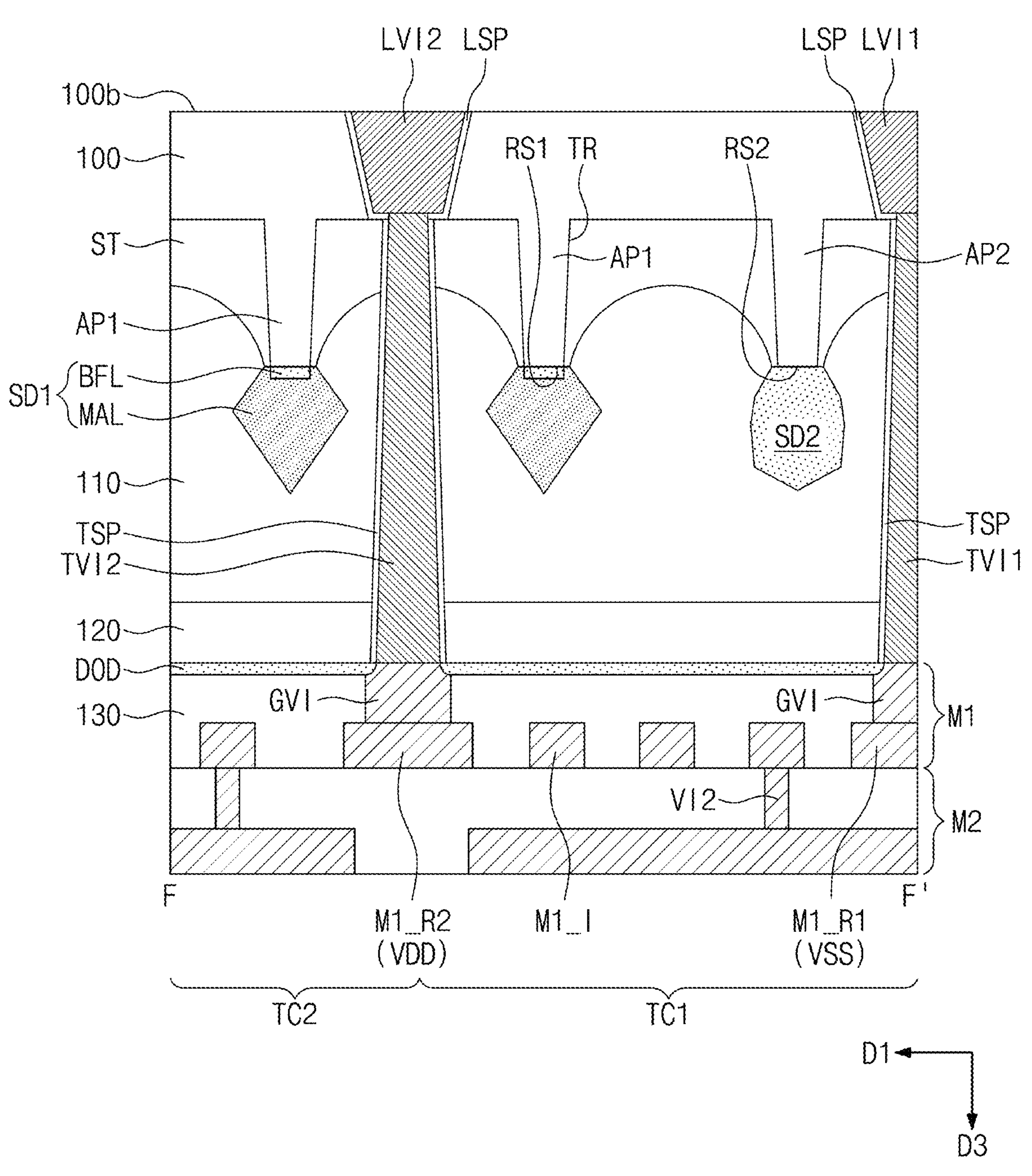

Referring to FIG. 14, a patterning process may be performed on the bottom surface 100*b* of the substrate 100 to form first to third lower conductors LVI1, LVI2, and LVI3. The first to third lower conductors LVI1, LVI2, and LVI3 may be vertically aligned with the first to third through-vias TVI1, TVI2, and TVI3, respectively. The first to third lower conductors LVI1, LVI2, and LVI3 may be directly connected to the first to third through-vias TVI1, TVI2, and TVI3, respectively. Afterwards, a power delivery network layer PDN may be formed on the bottom surface 100*b* of the substrate 100. The power delivery network layer PDN may be formed to apply a source voltage or a drain voltage to the first to third power lines M1_R1, M1_R2, and M1_R3.

Figure 12A:
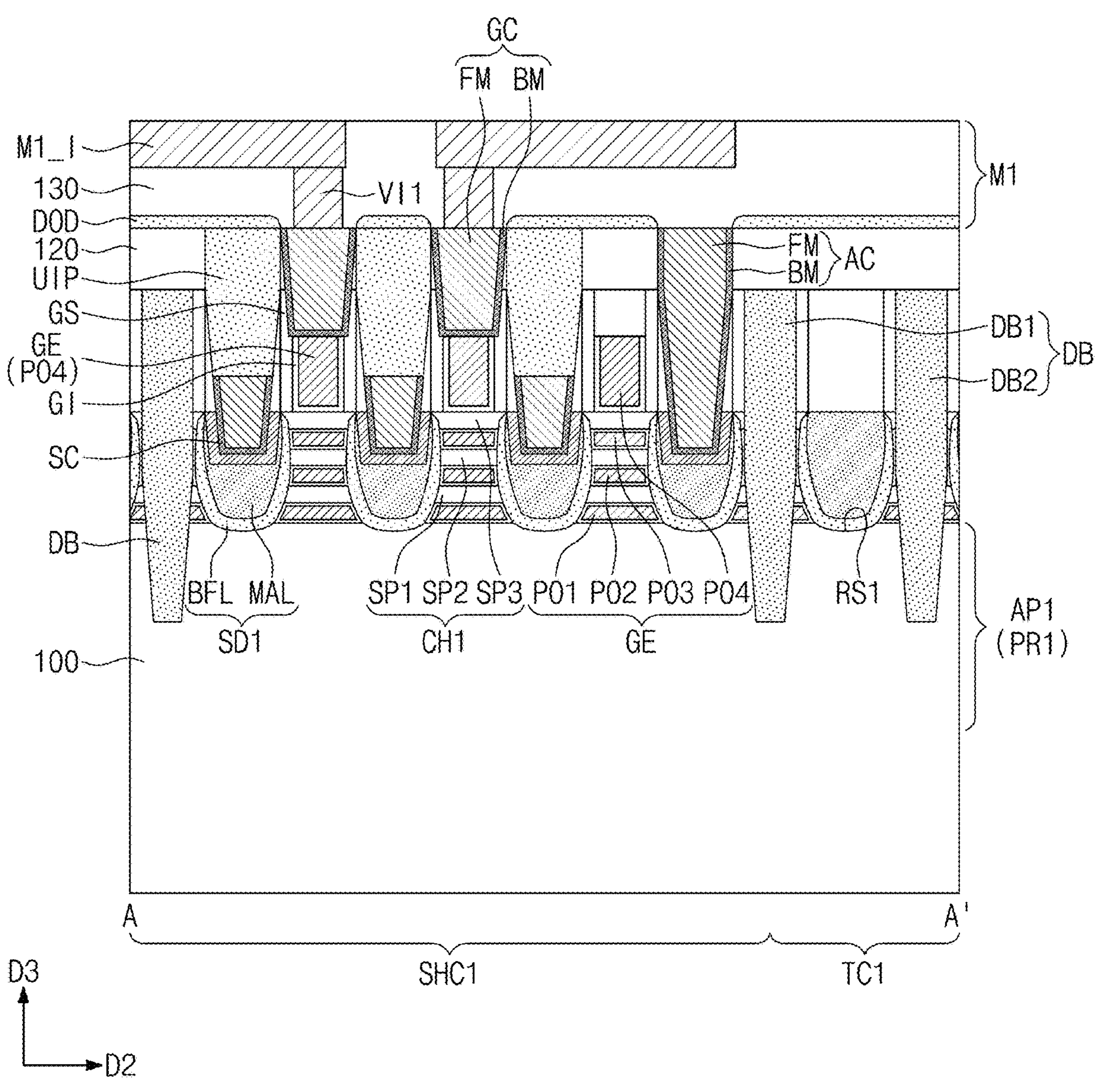
Figure 12B:
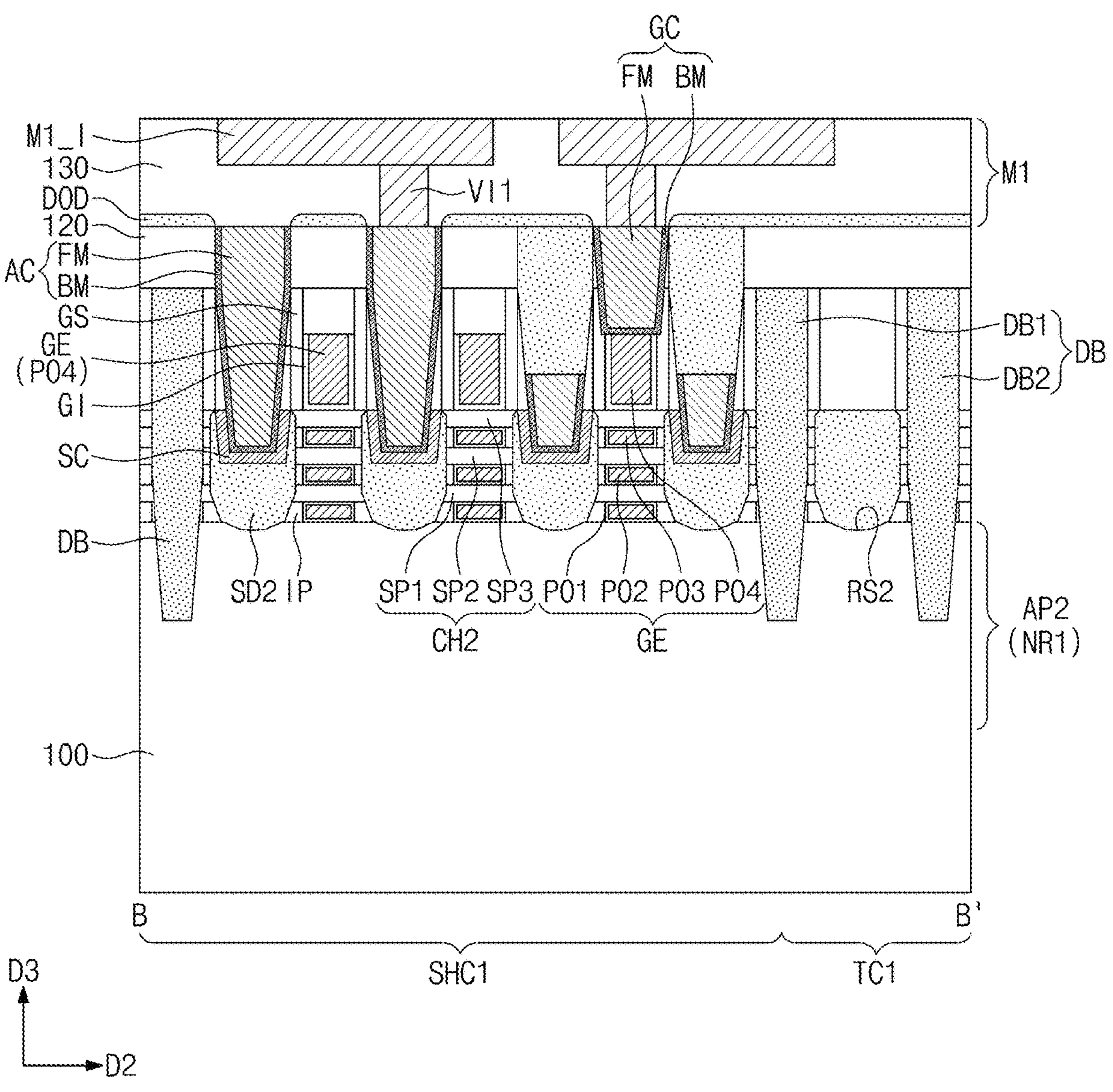
Figure 12C:
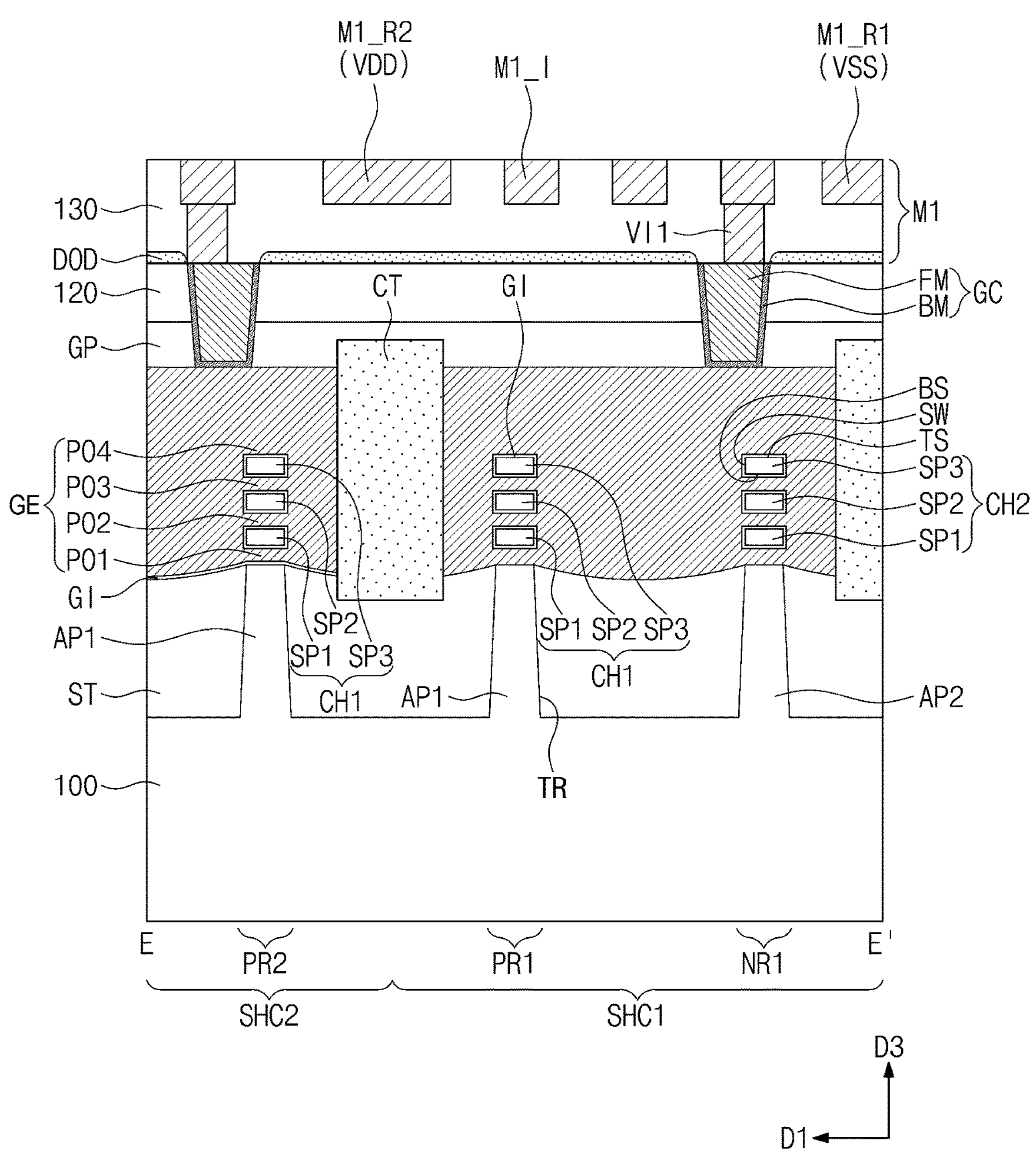
Figure 12D:
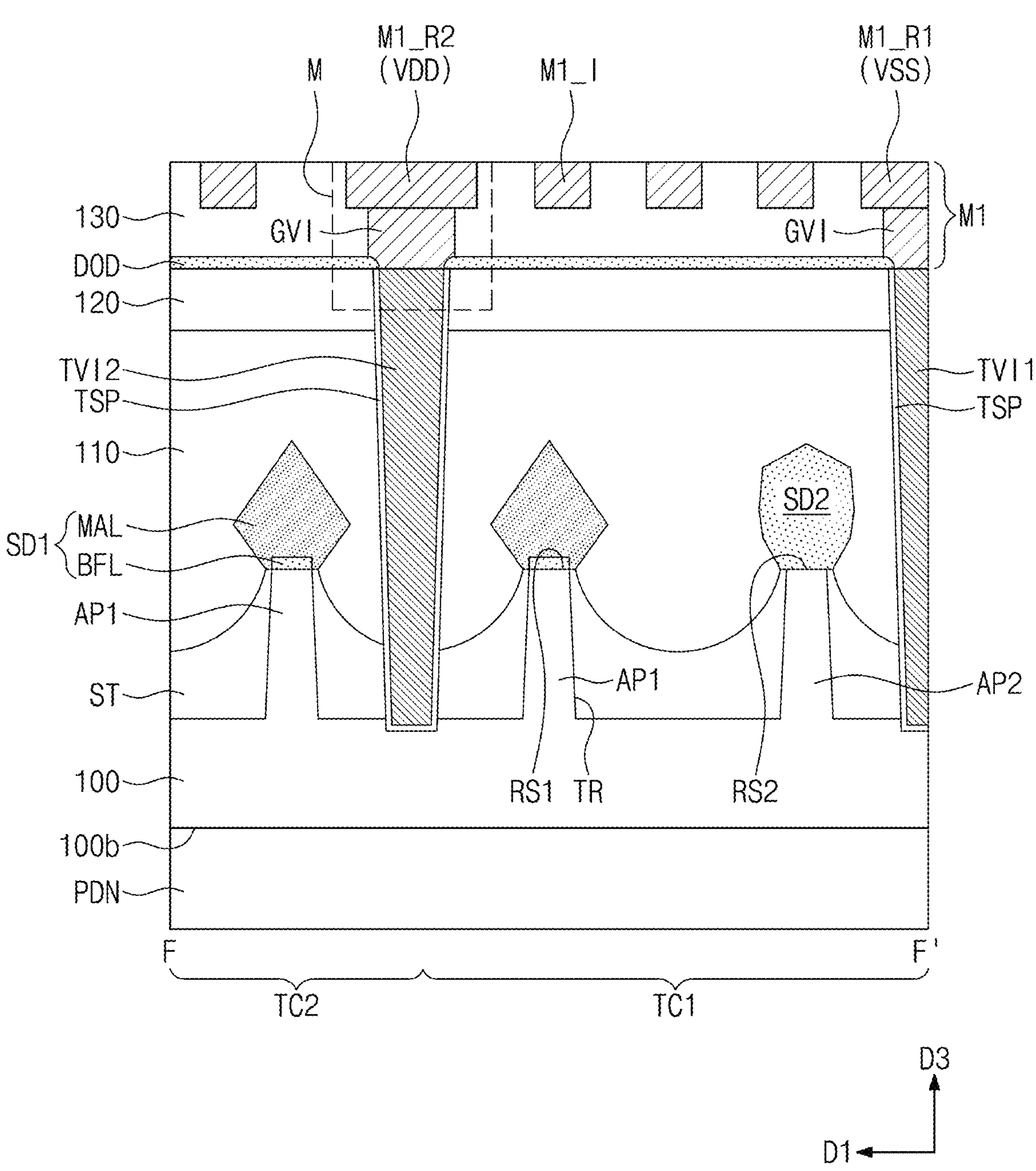
Figure 15:
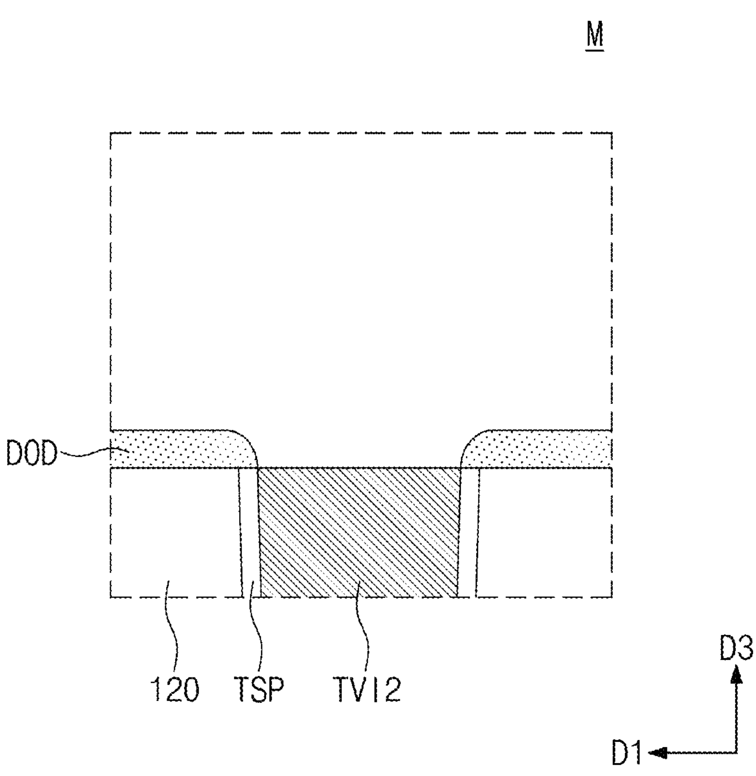
FIGS. 15 to 17 are enlarged cross-sectional views of region 'm' of FIG. 12D for illustrating a method of manufacturing a power via according to embodiments.
Figure 16:
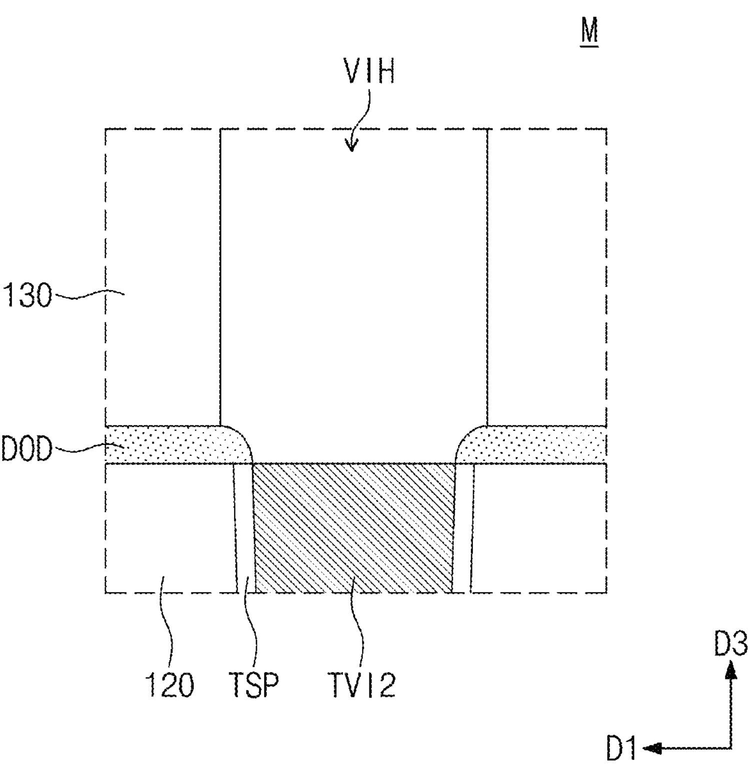
Figure 17:
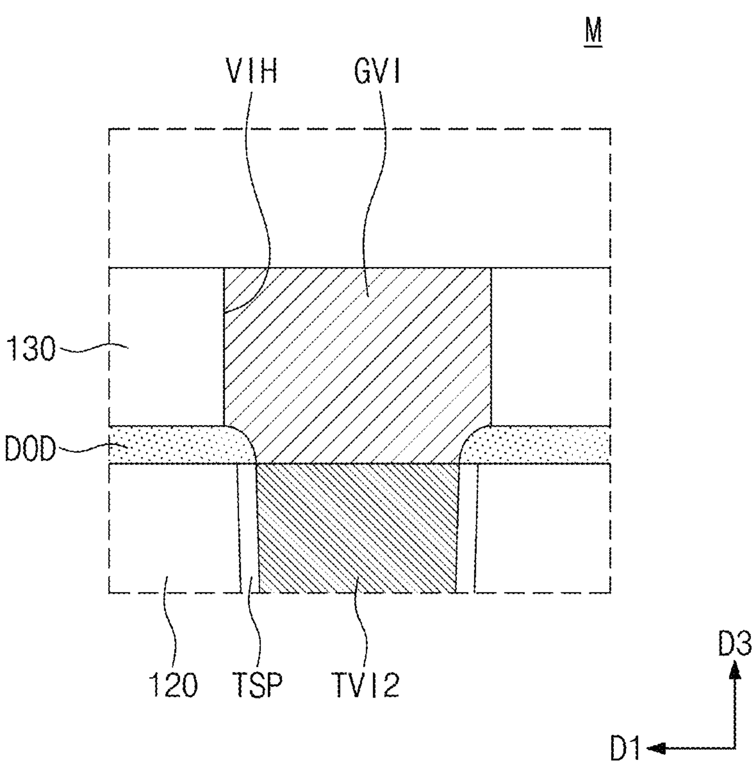

FIGS. 15 to 17 are enlarged cross-sectional views of region 'M' of FIG. 12D for illustrating a method of manufacturing a power via according to embodiments.

Referring to FIG. 15, the dielectric layer DOD may be selectively formed on the top surface of the second interlayer insulating layer 120. In detail, forming the dielectric layer DOD may include selectively providing an inhibitor on a top surface of the conductor AC, GC, TVI1, TVI2, or TVI3, and depositing a dielectric layer DOD on the second interlayer insulating layer 120. The inhibitor may prevent a precursor of the dielectric layer DOD from being attached to the top surface of the conductor AC, GC, TVI1, TVI2, or TVI3.

The dielectric layer DOD may contain "X" and "Y", where "X" is an element selected from the group consisting of Si, Ge, Al, Zr, Y, Hf, and Mo, and "Y" may be O or N. The dielectric layer DOD may further contain carbon (C) and/or hydrogen (H).

Referring to FIG. 16, a third interlayer insulating layer 130 may be formed on the dielectric layer DOD. A via hole VIH exposing a top surface of the second through-via TVI2 may be formed by patterning the third interlayer insulating layer 130. The patterning process may selectively etch only the third interlayer insulating layer 130 excluding the dielectric layer DOD. Therefore, even when a width (or diameter) of the via hole VIH is formed to be larger than a width (or diameter) of the second through-via TVI2, the via hole VIH selectively may expose only the top surface of the second through-via TVI2.

Referring to FIG. 17, a power via GVI may be formed by filling the via hole VIH with a conductive material. The power via GVI may be in direct contact with top surfaces of the dielectric layer DOD and the second through-via TVI2. A planarization process may be performed so that a top surface of the power via GVI may be coplanar with a top surface of the third interlayer insulating layer 130. Thereafter, a power line M1_R2 of the first metal layer M1 may be formed on the power via GVI. As an example, the power line M1_R2 may be formed through a single damascene process.

Hereinafter, various embodiments will be described. In embodiments to be described later, detailed descriptions of technical characteristics overlapping those described with reference to FIGS. 4 and 5A to 5F will be omitted, and differences will be described in detail.

FIGS. 18 to 21 are cross-sectional views taken along line C-C' of FIG. 4 for illustrating a semiconductor device according to another embodiment.

Figure 18:
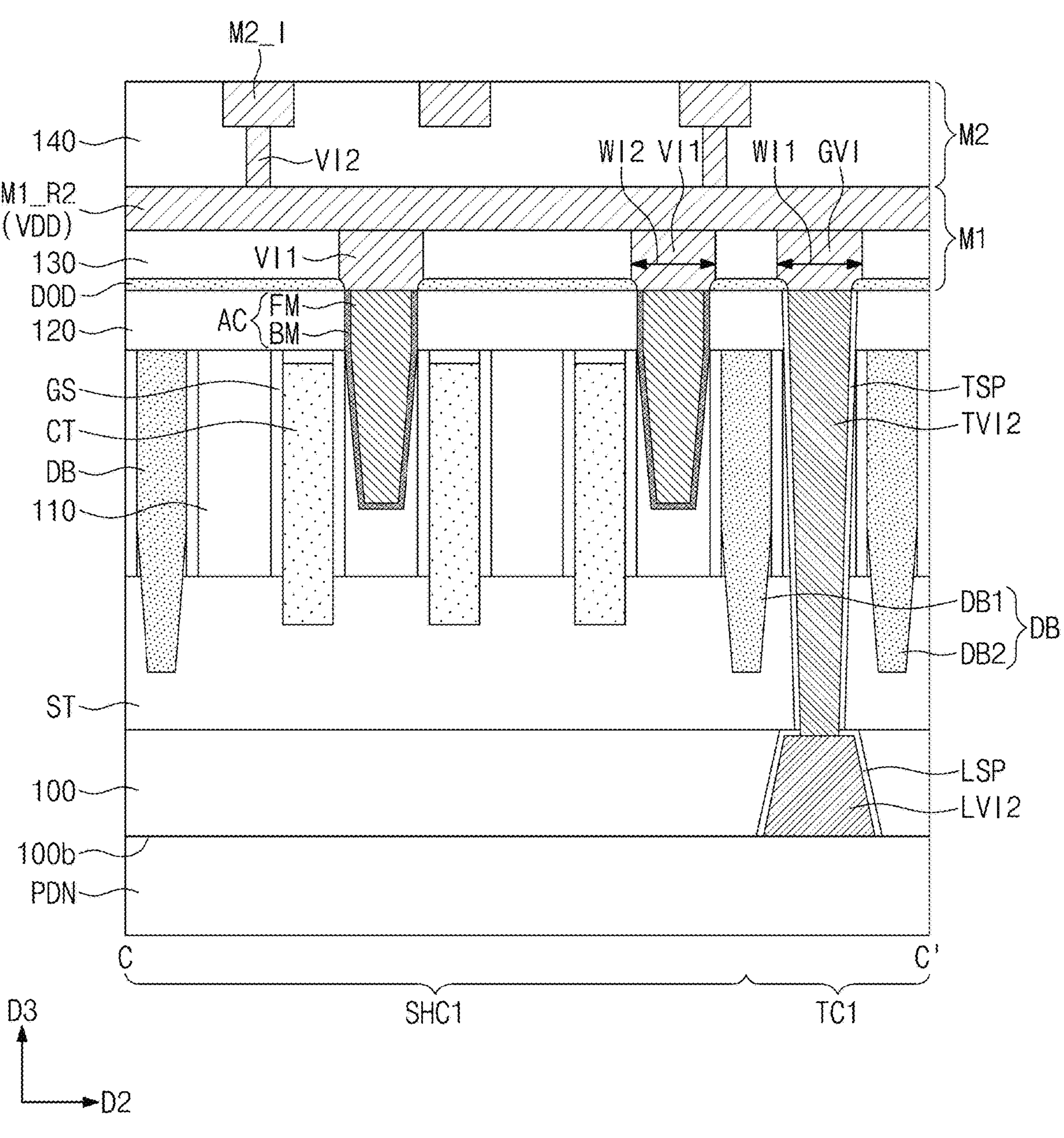
FIGS. 18 to 21 are cross-sectional views taken along line C-C' of FIG. 4 for illustrating a semiconductor device according to another embodiment.

Referring to FIG. 18, the power via GVI may have a first width WI1, and the first via VI1 may have a second width WI2. The first width WI1 and the second width WI2 may be substantially equal to each other. That is, the first via VI1 may also be formed in a self-aligned manner by the dielectric layer DOD, similar to the power via GVI. The first via VI1 may be in direct contact with a portion of the dielectric layer DOD and a top surface of the active contact AC.

Figure 19:
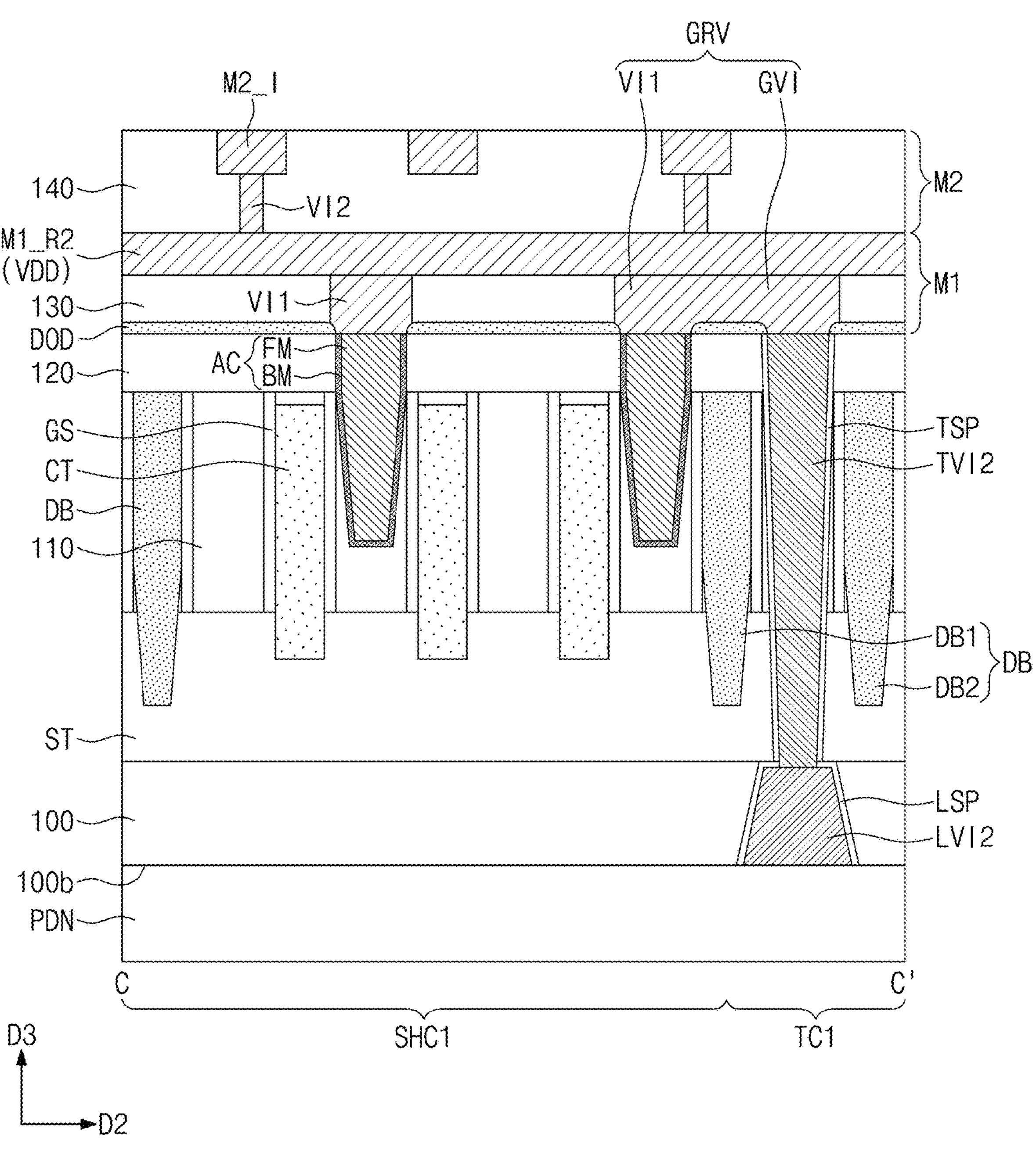

Referring to FIG. 19, the power via GVI and the first via VI1 adjacent thereto may be connected to each other to form one large via GRV. The large via GRV may have a bar shape extending in the second direction D2. The large via GRV may be formed in a self-aligned manner by the dielectric layer DOD. The large via GRV may be in common contact with the top surface of the active contact AC and the top surface of the second through-via TVI2. The large via GRV may be spaced apart from the second interlayer insulating layer 120 by the dielectric layer DOD.

The large via GRV according to the present embodiment may directly connect the second through-via TVI2 and the active contact AC, thereby shortening a current path and reducing resistance. In addition, the via GRV may be simply formed in a self-aligned manner by the dielectric layer DOD. As a result, electrical characteristics and reliability of the semiconductor device may be improved.

Figure 20:
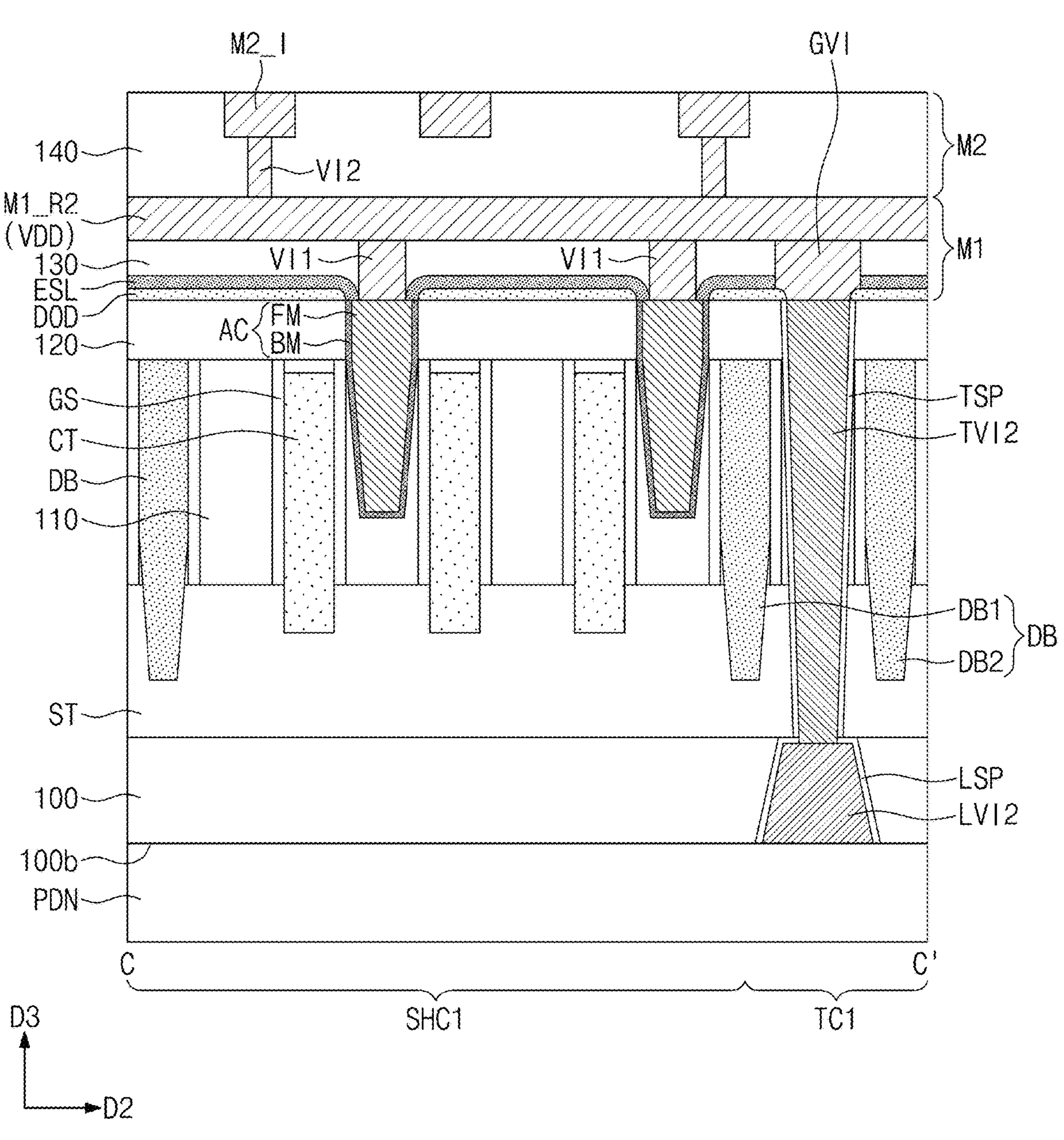

Referring to FIG. 20, an etch stop layer ESL may be further provided between the dielectric layer DOD and the third interlayer insulating layer 130. The etch stop layer ESL may directly cover the dielectric layer DOD. The power via GVI and the first via VI1 may be stably formed by the etch stop layer ESL without over-etching.

In an embodiment, the etch stop layer ESL may include a single layer (a metal oxide layer or a silicon-based insulating layer). In another embodiment, the etch stop layer ESL may include a multi-layer. For example, the etch stop layer ESL may include a first etch stop layer, a second etch stop layer, and a third etch stop layer sequentially stacked.

In detail, the first etch stop layer may be formed of a material having high dielectric and low density characteristics. The first etch stop layer may include a metal oxide containing at least one metal selected from the group consisting of Al, Zr, Y, Hf, and Mo. The first etch stop layer may have etch selectivity with respect to the dielectric layer DOD.

The second etch stop layer on the first etch stop layer may be formed of a material having low dielectric and high density characteristics. The second etch stop layer may contain "X", "Y" and carbon (C). "X" may be an element selected from the group consisting of Si, Ge, Al, Zr, Y, Hf, and Mo, and "Y" may be O or N.

The third etch stop layer on the second etch stop layer may be a metal oxide and may contain at least one metal selected from the group consisting of Al, Zr, Y, Hf, and Mo. For example, the third etch stop layer may include the same material as that of the first etch stop layer.

Figure 21:
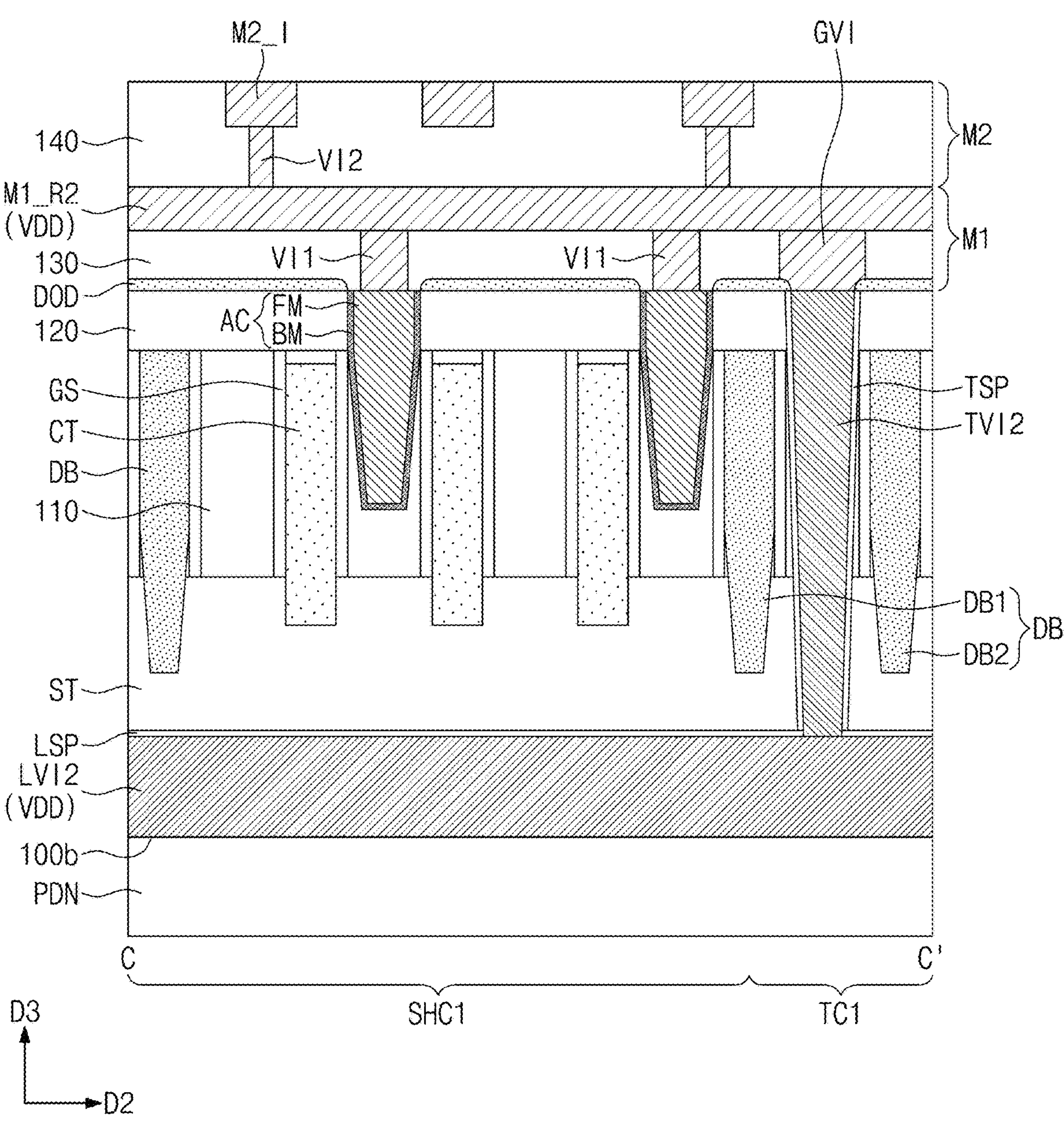

Referring to FIG. 21, each of the lower conductors LVI1, LVI2, and LVI3 may have a line shape extending in the second direction D2. Each of the lower conductors LVI1, LVI2, and LVI3 may function as a lower power line buried under the substrate 100.

The second lower conductor LVI2 may be a VDD line and may vertically overlap the second power line M1_R2. Current may flow not only through the second power line M1_R2 but also through the second lower conductor LVI2. Accordingly, concentration of current flowing to the second power line M1_R2 may be prevented, and the current may be distributed to the second power line M1_R2 and the second lower conductor LVI2, thereby improving electrical characteristics of the device.

The semiconductor device according to embodiments may allow the power vias to be connected to the through-vias in the self-aligned manner through the dielectric layer selectively provided only on the top surface of the interlayer insulating layer. Accordingly, the width of the power via may become greater than the width of the through-via, thereby improving the reliability and electrical characteristics of the semiconductor device.

By way of summation and review, embodiments may provide a semiconductor device having improved electrical characteristics and reliability.

Embodiments may also provide a method of manufacturing a semiconductor device having improved electrical characteristics and reliability Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
active patterns adjacent to each other on a substrate;
source/drain patterns adjacent to each other on the active patterns, respectively;
a first separation structure and a second separation structure crossing the active patterns, wherein the source/drain patterns that are adjacent to each other are interposed between the first and second separation structures;
an interlayer insulating layer on the source/drain patterns and the first and second separation structures;
a through-via between a first source/drain pattern of the source/drain patterns and a second source/drain pattern of the source/drain patterns adjacent to the first source/drain pattern, the through-via penetrating through the interlayer insulating layer and extending toward the substrate, wherein a top surface of the through-via is coplanar with a top surface of the interlayer insulating layer;
a dielectric layer selectively provided on the top surface of the interlayer insulating layer, the dielectric layer having an opening exposing the top surface of the through-via;
a power via extending through the opening of the dielectric layer to connect to the top surface of the through-via, wherein the dielectric layer is configured to guide the power via to the top surface of the through-via;
a power line provided on the power via, the power line being electrically connected to the through-via through the power via;
a power delivery network layer on a bottom surface of the substrate; and
a lower conductor between the power delivery network layer and the through-via.

2. The semiconductor device as claimed in claim 1, wherein a width of the power via is greater than a width of the through-via.

3. The semiconductor device as claimed in claim 1, wherein the power via is in contact with at least a portion of the dielectric layer.

4. The semiconductor device as claimed in claim 1, further comprising:
an active contact electrically connected to at least one of the active patterns; and
a first via between the active contact and the power line,
wherein the dielectric layer is configured to guide the first via to connect to a top surface of the active contact.

5. The semiconductor device as claimed in claim 1, further comprising:
an active contact electrically connected to at least one of the active patterns; and
a first via between the active contact and the power line,
wherein the first via and the power via are connected to each other to form one large via, and
wherein the large via is spaced apart from the interlayer insulating layer by the dielectric layer.

6. The semiconductor device as claimed in claim 1, further comprising an etch stop layer on the dielectric layer,
wherein the power via passes through the etch stop layer and is in contact with the top surface of the through-via.

7. The semiconductor device as claimed in claim 1, wherein the power delivery network layer is configured to apply a source voltage or a drain voltage to the power line.

8. The semiconductor device as claimed in claim 1, wherein the lower conductor vertically overlaps the power line, and
wherein the lower conductor has a line shape or a contact shape.

9. The semiconductor device as claimed in claim 1, wherein a width of the through-via decreases as the through-via approaches the bottom surface of the substrate, and
wherein a width of the lower conductor increases as the lower conductor approaches the bottom surface of the substrate.

10. The semiconductor device as claimed in claim 1, wherein the through-via is interposed between the first and second separation structures.

11. A semiconductor device comprising:
a plurality of power lines on a substrate, the plurality of power lines being arranged in a first direction and parallel to each other in a second direction;
a plurality of logic cells two-dimensionally arranged on the substrate;
a plurality of tap cells arranged on the substrate in the first direction; and
a power delivery network layer below the substrate,
wherein each of the plurality of tap cells includes:
a lower conductor buried in a lower portion of the substrate, the lower conductor electrically connected to the power delivery network layer;
a through-via passing through an interlayer insulating layer and connected to the lower conductor;
a dielectric layer selectively provided on a top surface of the interlayer insulating layer, the dielectric layer having an opening exposing a top surface of the through-via; and
a power via electrically connecting the through-via to a corresponding one of the power lines,
wherein the power via is in direct contact with the top surface of the through-via, and
wherein a width of the power via is greater than a width of the through-via.

12. The semiconductor device as claimed in claim 11, wherein the power via is spaced apart from the interlayer insulating layer by the dielectric layer.

13. The semiconductor device as claimed in claim 11, wherein each of the plurality of tap cells further includes a first separation structure on a first boundary of a respective tap cell and a second separation structure on a second boundary of the respective tap cell.

14. The semiconductor device as claimed in claim 11, wherein each of the plurality of tap cells further includes an etch stop layer on the dielectric layer, and
wherein the power via passes through the etch stop layer and is in contact with the top surface of the through-via.

15. The semiconductor device as claimed in claim 11, wherein the power delivery network layer is configured to apply a source voltage or a drain voltage to each power line of the plurality of power lines.

16. A semiconductor device comprising:
a first power line and a second power line on a substrate, the first and second power lines being spaced apart from each other in a first direction and extending parallel to each other in a second direction;

a logic cell and a tap cell that are between the first and second power lines, the logic cell and the tap cell being adjacent to each other in the second direction;

a first active pattern and a second active pattern on the logic cell, the first and second active patterns being spaced apart from each other in the first direction;

a first channel pattern and a first source/drain pattern on the first active pattern;

a second channel pattern and a second source/drain pattern on the second active pattern, the second source/drain pattern having a conductivity type different from that of the first source/drain pattern;

an interlayer insulating layer on the first and second source/drain patterns;

a first active contact and a second active contact electrically connected to the first and second source/drain patterns, respectively, through the interlayer insulating layer;

a first through-via and a second through-via on the tap cell, the first and second through-vias passing through the interlayer insulating layer and extending toward the substrate;

a dielectric layer selectively provided on a top surface of the interlayer insulating layer, the dielectric layer having openings exposing top surfaces of the first and second through-vias and top surfaces of the first and second active contacts;

a first power via contacting the top surface of the first through-via exposed by the openings in the dielectric layer, the first power via electrically connecting the first through-via to the first power line;

a second power via contacting the top surface of the second through-via exposed by the openings in the dielectric layer, the second power via electrically connecting the second through-via to the second power line;

a first via in contact with the top surface of the first active contact exposed by the openings in the dielectric layer, the first via electrically connecting the first active contact to the first power line;

a second via in contact with the top surface of the second active contact exposed by the openings in the dielectric layer, the second via electrically connecting the second active contact to the second power line;

a power delivery network layer provided on a bottom surface of the substrate; and a first lower conductor and a second lower conductor respectively provided between the power delivery network layer and the first and second through-vias.

17. The semiconductor device as claimed in claim 16, further including a first separation structure provided on a first boundary of the tap cell and a second separation structure provided on a second boundary of the tap cell, wherein first and second boundaries face each other in the second direction, wherein each of the first and second through-vias is interposed between the first and second separation structures.

18. The semiconductor device as claimed in claim 16, further including:

a gate electrode on the first and second channel patterns;

a gate insulating layer interposed between the gate electrode and the first and second channel patterns;

a gate spacer on a sidewall of the gate electrode;

a gate capping pattern on a top surface of the gate electrode; and a gate contact electrically connected to the gate electrode through the interlayer insulating layer and the gate capping pattern.

19. The semiconductor device as claimed in claim 16, wherein the power delivery network layer is configured to apply a source voltage to one of the first and second power lines, and wherein the power delivery network layer is configured to apply a drain voltage to the other one of the first and second power lines.

20. The semiconductor device as claimed in claim 16, wherein a width of the first power via is greater than a width of the first through-via, and wherein a width of the second power via is greater than a width of the second through-via.

* * * * *